(12) United States Patent
Nam et al.

(10) Patent No.: US 8,981,468 B2
(45) Date of Patent: Mar. 17, 2015

(54) SEMICONDUCTOR DEVICES AND METHOD OF MANUFACTURING THE SAME

(71) Applicant: Samsung Electronics Co., Ltd., Suwon-si, Gyeonggi-do (KR)

(72) Inventors: Ki-hyung Nam, Yongin-si (KR); Yong Kwan Kim, Yongin-si (KR); Chan Ho Park, Incheon (KR); Pulunsol Cho, Gwacheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 13/943,208

(22) Filed: Jul. 16, 2013

(65) Prior Publication Data

US 2014/0021551 A1    Jan. 23, 2014

(30) Foreign Application Priority Data

Jul. 17, 2012    (KR) .......................... 10-2012-0077959

(51) Int. Cl.
| | |
|---|---|
| *H01L 29/78* | (2006.01) |
| *H01L 29/66* | (2006.01) |
| *H01L 45/00* | (2006.01) |
| *H01L 27/22* | (2006.01) |

(52) U.S. Cl.
CPC ...... *H01L 29/7831* (2013.01); *H01L 29/66484* (2013.01); *H01L 45/06* (2013.01); *H01L 27/228* (2013.01)
USPC .......................................... 257/330; 257/365

(58) Field of Classification Search
CPC ..................... H01L 29/66484; H01L 29/7831; H01L 27/228
USPC .................................................. 257/330, 365
See application file for complete search history.

(56) References Cited

U.S. PATENT DOCUMENTS

| | | | |
|---|---|---|---|
| 7,659,170 B2 | 2/2010 | Schwan et al. | |
| 2007/0207582 A1 * | 9/2007 | Grivna et al. | 438/270 |

FOREIGN PATENT DOCUMENTS

| | | |
|---|---|---|
| JP | 2002-270797 A | 9/2002 |
| JP | 2005-150565 A | 6/2005 |
| KR | 10-2004-0003900 A | 1/2004 |
| KR | 10-2009-0019234 A | 2/2009 |
| KR | 10-2010-0129579 A | 12/2010 |
| KR | 10-2013-0098684 A | 9/2013 |

* cited by examiner

*Primary Examiner* — Tran Tran
(74) *Attorney, Agent, or Firm* — Lee & Morse, P.C.

(57) ABSTRACT

Disclosed are semiconductor devices and methods of manufacturing the same. The semiconductor device includes active portions defined in a semiconductor substrate, a device isolation pattern in a trench formed between the active portions, a gate electrode in a gate recess region crossing the active portions and the device isolation pattern, a gate dielectric layer between the gate electrode and an inner surface of the gate recess region, and a first ohmic pattern and a second ohmic pattern on each of the active portions at both sides of the gate electrode, respectively. The first and second ohmic patterns include a metal-semiconductor compound, and a top surface of the device isolation pattern at both sides of the gate recess region is recessed to be lower than a level of a top surface of the semiconductor substrate.

10 Claims, 23 Drawing Sheets

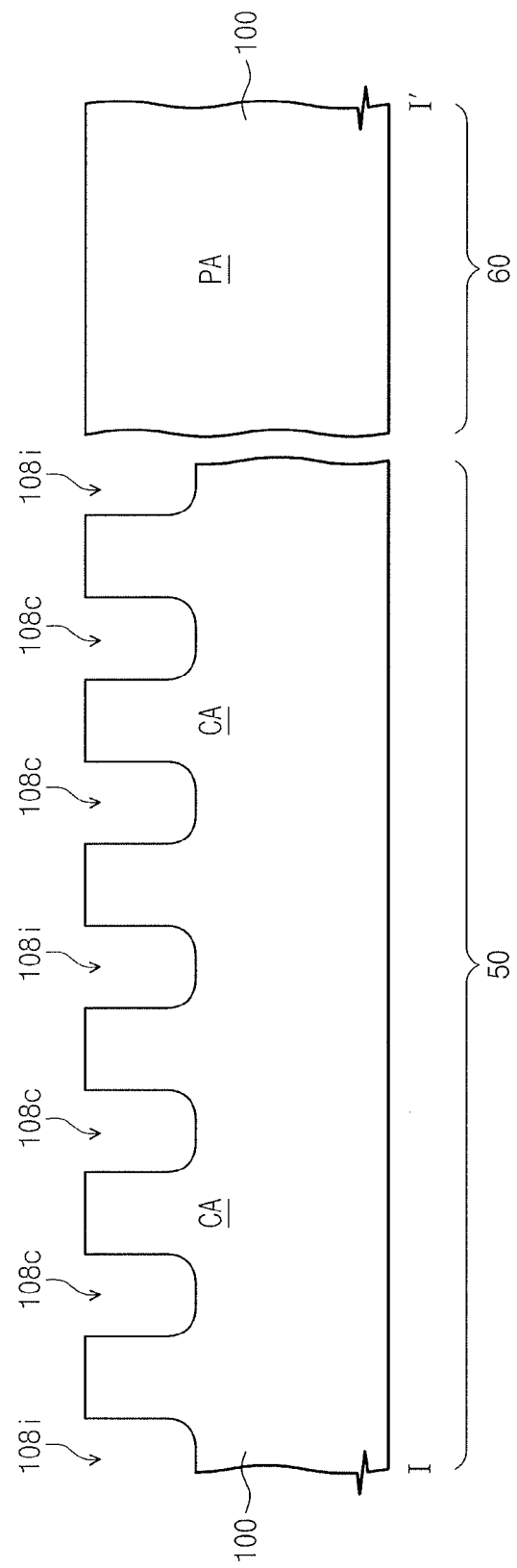

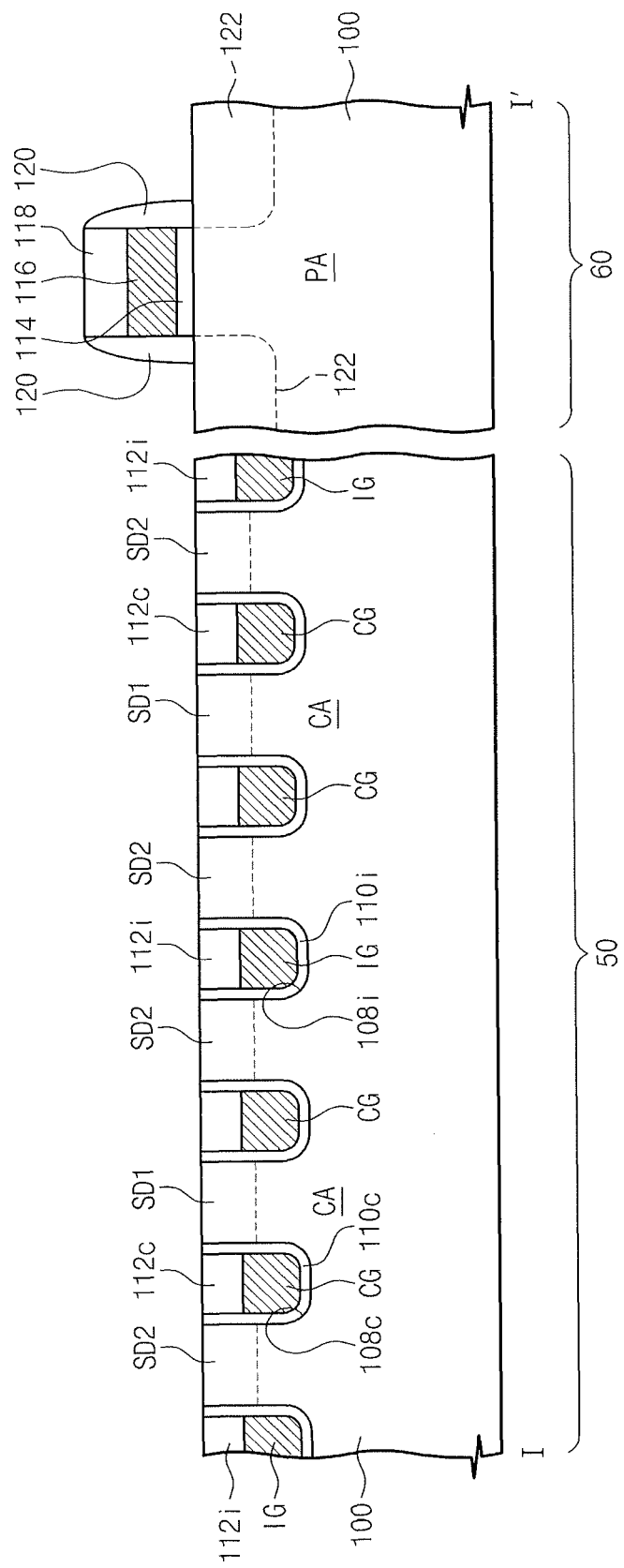

SEMICONDUCTOR DEVICES AND METHOD OF MANUFACTURING THE SAME

CROSS-REFERENCE TO RELATED APPLICATIONS

The present application claims priority under 35 U.S.C. §119 to and benefit of Korean Patent Application No. 10-2012-0077959, filed on Jul. 17, 2012, in the Korean Intellectual Property Office, and entitled: "Semiconductor Devices and Method of Manufacturing the Same," which is incorporated by reference herein in its entirety.

BACKGROUND

1. Field

Embodiments relate to semiconductor devices and methods of manufacturing the same and, more particularly, to semiconductor devices including ohmic patterns and methods of manufacturing the same.

2. Description of the Related Art

Semiconductor devices are widely used in an electronic industry because of small size, multi-function and/or low manufacture costs thereof. The semiconductor devices have been more highly integrated with the development of the electronic industry. Thus, widths of elements constituting the semiconductor device may be reduced and a contact resistance between the elements may increase.

For reducing the contact resistance, an ohmic pattern may be formed between the elements. However, neighboring ohmic patterns may be shorted to each other by high integration of the semiconductor device, such that reliability of the semiconductor device may be deteriorated. Thus, various researches have been conducted for improving the reliability of the semiconductor device.

SUMMARY

One or more embodiments are directed to providing a semiconductor device including active portions defined in a semiconductor substrate, a device isolation pattern disposed in a trench formed between the active portions, a gate electrode disposed in a gate recess region crossing the active portions and the device isolation pattern, a gate dielectric layer disposed between the gate electrode and an inner surface of the gate recess region, and a first ohmic pattern and a second ohmic pattern disposed on each of the active portions at both sides of the gate electrode, respectively. The first and second ohmic patterns may include a metal-semiconductor compound. A top surface of the device isolation pattern disposed at both sides of the gate recess region may be recessed to be lower than a level of a top surface of the semiconductor substrate.

In some embodiments, the recessed top surface of the device isolation pattern disposed at a first side of the gate recess region may be disposed between the first ohmic patterns which are disposed on the active portions, respectively, and are adjacent to each other in a longitudinal direction of the gate electrode; and the recessed top surface of the device isolation pattern disposed at a second side of the gate recess region may be disposed between the second ohmic patterns which are disposed on the active portions, respectively, and are adjacent to each other in the longitudinal direction of the gate electrode.

In some embodiments, the semiconductor device may further include a sidewall oxide pattern formed on an inner sidewall and a bottom surface of the trench. In this case, the device isolation pattern may be disposed on the sidewall oxide pattern and in the trench, and a top end of the sidewall oxide pattern formed on the inner sidewall of the trench may be higher than the recessed top surface of the device isolation pattern.

In some embodiments, the semiconductor device may further include a capping insulating pattern disposed on the gate electrode. A top surface of the gate electrode may be disposed at a level lower than the level of the top surface of the semiconductor substrate and the capping insulating pattern may be disposed in the gate recess region.

In some embodiments, a top surface of the capping insulating pattern may be disposed at a level higher than the recessed top surface of the device isolation pattern and the capping insulating pattern may be formed of a different insulating material from the device isolation pattern.

In some embodiments, a top surface of the capping insulating pattern may be disposed at substantially the same level as the recessed top surface of the device isolation pattern; and the capping insulating pattern may be formed of the same insulating material as the device isolation pattern.

In some embodiments, bottom surfaces of the first and second ohmic patterns may be disposed at a level higher than a top surface of the gate electrode.

In some embodiments, the recessed top surface of the device isolation pattern may be disposed at a level higher than a bottom end of the gate electrode.

In some embodiments, the semiconductor device may further include isolation gates disposed in isolation recess regions formed in the semiconductor substrate, respectively, and an isolation gate dielectric layer disposed between each of the isolation gates and each of the isolation recess regions. The isolation recess regions may be parallel to the gate recess region; and the active portion may be defined between the isolation gates adjacent to each other.

In some embodiments, the semiconductor device may further include a source line electrically connected to the first ohmic pattern and a data storage part electrically connected to the second ohmic pattern.

One or more embodiments are directed to providing a method of manufacturing a semiconductor device that may include forming active portions and a trench between the active portions in a semiconductor substrate, forming a device isolation pattern in the trench; forming a gate recess region crossing the active portions and the device isolation pattern; sequentially forming a gate dielectric layer, a gate electrode, and a capping insulating pattern in the gate recess region; recessing a top surface of the device isolation pattern at both sides of the gate recess region, the recessed top surface of device isolation pattern lower than a top surface of the semiconductor substrate; forming a metal layer contacting top surfaces of the active portions disposed at both sides of the gate electrode, reacting a metal in the metal layer with a semiconductor material of each of the active portions to form first and second ohmic patterns, and removing a non-reacted metal layer.

In some embodiments, the method may further include forming a sidewall oxide pattern on an inner sidewall and a bottom surface of the trench before forming the device isolation pattern. The device isolation pattern may be formed of a different insulating material from the sidewall oxide pattern and a top end of the sidewall oxide pattern on the inner sidewall of the trench may be higher than the recessed top surface of the device isolation pattern after recessing the top surface of the device isolation pattern at both sides of the gate recess region.

In some embodiments, the capping insulating pattern may be formed of a different insulating material from the device isolation pattern and a top surface of the capping insulating pattern may be higher than the recessed top surface of the device isolation pattern after recessing the top surface of the device isolation pattern at both sides of the gate recess region.

In some embodiments, the capping insulating pattern may be formed of the same material as the device isolation pattern, a top surface of the capping insulating pattern may be recessed when the top surface of the device isolation pattern at both sides of the gate recess region is recessed, and the recessed top surface of the device isolation pattern may be higher than a top surface of the gate electrode.

In some embodiments, before recessing the top surface of the device isolation pattern at both sides of the gate recess region, the method may further include: forming isolation recess regions in the semiconductor substrate; and sequentially forming an isolation gate dielectric layer, an isolation gate, and an isolation capping insulating pattern in each of the isolation recess regions. The active portion may be defined between the isolation recess regions adjacent to each other.

One or more embodiments are directed to providing a semiconductor device, including active portions defined in a semiconductor substrate, trenches between the active portions, sidewall oxide patterns on inner surfaces of the trenches, device isolation patterns in the trenches and on the sidewall oxide patterns, upper edges of the sidewall oxide patterns protruding from the device isolation patterns, a gate electrode in a gate recess region crossing the active portions and the device isolation pattern, and a gate dielectric layer between the gate electrode and an inner surface of the gate recess region.

In some embodiments, the device may include a capping insulating pattern on the gate electrode, wherein a top surface of the gate electrode is at a level lower than the level of the top surface of the semiconductor substrate, and wherein the capping insulating pattern is in the gate recess region.

In some embodiments, the sidewall oxide patterns and the device isolation patterns are formed of different materials.

BRIEF DESCRIPTION OF THE DRAWINGS

Features will become apparent to those of ordinary skill in the art by describing in detail exemplary embodiments with reference to the attached drawings in which:

FIGS. 4A to 9A illustrate cross-sectional views taken along a line I-I' of FIG. A to explain stages in a method of manufacturing a semiconductor device according to an embodiments;

FIGS. 4B to 9B illustrate cross-sectional views taken along a line II-II' of FIG. 1A to explain stages in a method of manufacturing a semiconductor device according to an embodiment;

DETAILED DESCRIPTION

Figure 1A:
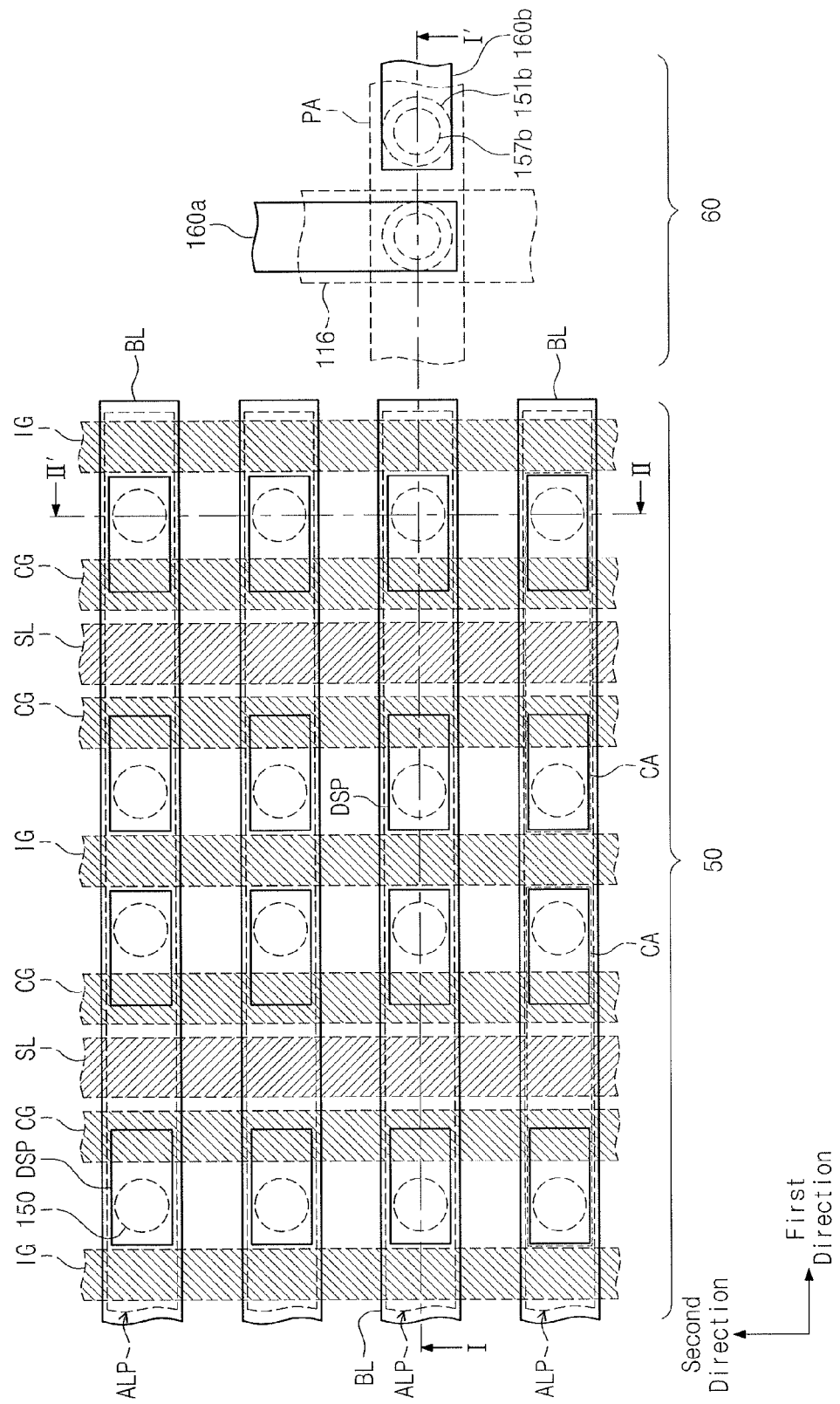
FIG. 1A illustrates a plan view of a semiconductor device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration.

The terminology used herein is for the purpose of describing particular embodiments only and is not intended to be limiting. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of embodiments. Accordingly, shapes of the exemplary views may be modified according to manufacturing techniques and/or allowable errors. Therefore, the embodiments are not limited to the specific shape illustrated in the exemplary views, but may include other shapes that may be created according to manufacturing processes. Areas exemplified in the drawings have general properties, and are used to illustrate specific shapes of elements.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings herein Exemplary embodiments of aspects explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Figure 1B:
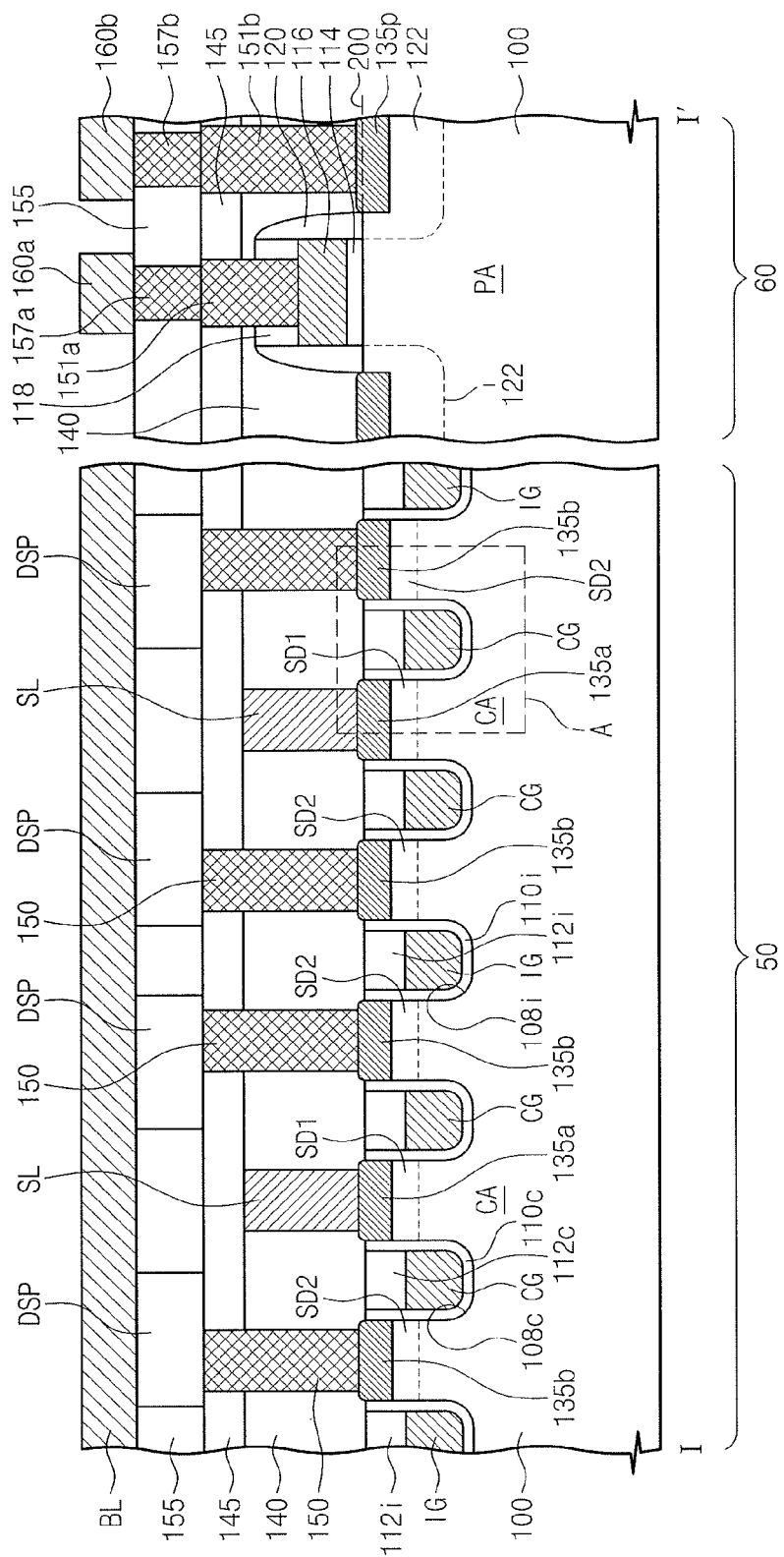
FIG. 1B illustrates a cross-sectional view taken along a line I-I' of FIG. 1A.
Figure 1C:
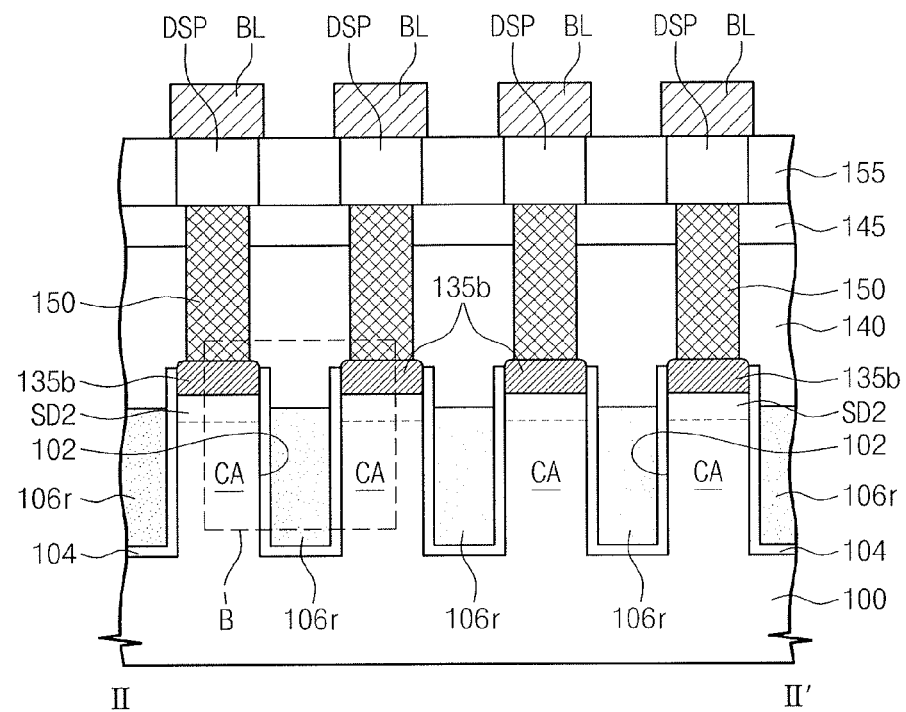
FIG. 1C illustrates a cross-sectional view taken along a line II-II' of FIG. 1A.
Figure 1D:
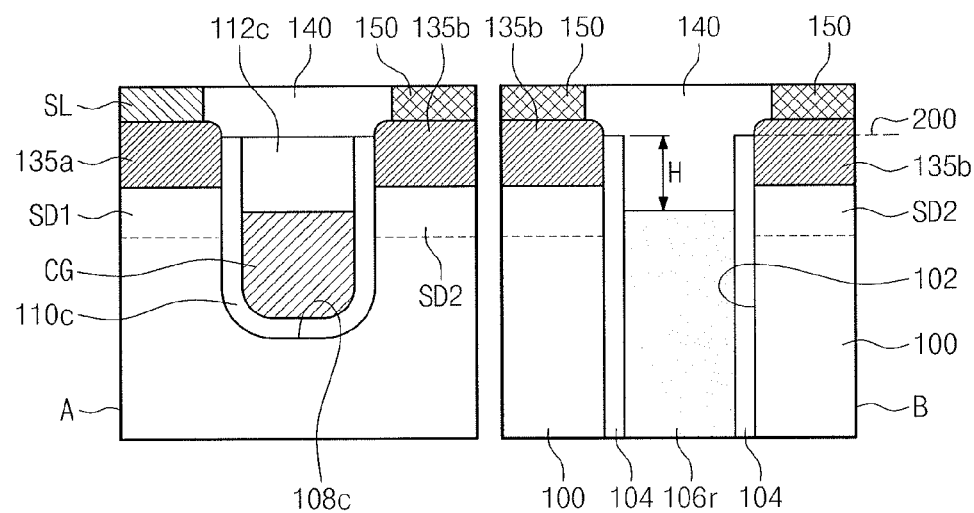
FIG. 1D illustrates an enlarged view of a portion A of FIG. 1B and a portion B of FIG. 1C.

FIG. 1A illustrates a plan view of a semiconductor device according to an embodiment. FIG. 1B illustrates a cross-sectional view taken along a line I-I' of FIG. 1A. FIG. 1C illustrates a cross-sectional view taken along a line II-II' of FIG. 1A. FIG. 1D illustrates an enlarged view of a portion A of FIG. 1B and a portion B of FIG. 1C.

Referring FIGS. 1A, 1B, 1C, and 1D, a semiconductor substrate 100 may include a first region 50 and a second region 60. In some embodiments, the first region 50 may correspond to a cell region including memory cells, and the second region 60 may correspond to a peripheral circuit region including a peripheral circuit. The semiconductor substrate 100 may be, e.g., a silicon substrate, a germanium substrate, a silicon-germanium substrate, and so forth.

Cell device isolation patterns 106r may be disposed in cell trenches 102 formed in the semiconductor substrate 100 of the first region 50, respectively. The cell device isolation patterns 106r and the cell trenches 102 may define active line patterns ALP extending in parallel to each other in a first direction when viewed from a top view. The cell device isolation patterns 106r may also extend in the first direction. Each of the active line patterns ALP may be a portion of the semiconductor substrate 100 defined by the cell device isolation patterns 106r in the first region 50. The active line patterns ALP may be doped with dopants of a first conductivity type. A peripheral device isolation pattern may be disposed in a peripheral trench formed in the semiconductor substrate 100 of the second region 60. The peripheral device isolation pattern may define a peripheral active portion PA in the second region 60. The peripheral active portion PA may correspond to a portion of the semiconductor substrate 100 surrounded by the peripheral device isolation pattern in the second region 60. The peripheral active portion PA may be doped with dopants of the first conductivity type or a second conductivity type different from the first conductivity type. A depth of the cell trench 102 may be substantially equal to or different from a depth of the peripheral trench.

A cell sidewall oxide pattern 104 may be substantially conformally disposed on an inner sidewall and a bottom surface of each of the cell trenches 102. The cell device isolation pattern 106r may be disposed on the cell sidewall oxide pattern 104. In other words, the cell sidewall oxide pattern 104 may be disposed between the inner surface (i.e., the inner sidewall and the bottom surface) of the cell trench 102 and the cell device isolation pattern 106r. Likewise, a peripheral sidewall oxide pattern (not shown) may be substantially conformally disposed on an inner sidewall and a bottom surface of the peripheral trench, and the peripheral device isolation pattern may be disposed on the peripheral sidewall oxide pattern.

Isolation recess regions 108i may cross the active line patterns ALP and the cell device isolation patterns 106r. In a plan view, the isolation recess regions 108i may be groove-shapes extending in parallel to each other in a second direction perpendicular to the first direction. The isolation recess regions 108i may divide each of the active line patterns ALP into cell active portions CA. Each of the cell active portions CA may be a portion of the active line pattern ALP which is disposed between a pair of the isolation recess regions 108i adjacent to each other. In other words, each of the cell active portions CA may be defined by a pair of the cell device isolation patterns 106r adjacent to each other and the pair of the isolation recess regions 108i adjacent to each other. When viewed from a top view, the cell active portions CA may be arranged along rows and columns. The cell active portions CA divided from each of the active line patterns ALP may constitute each of the rows, and the cell active portions CA disposed between the pair of the isolation recess regions 108i adjacent to each other may be arranged in the second direction to constitute each of the columns.

At least one gate recess region 108c may cross the cell active portions CA in each of the columns. The gate recess region 108c may have a groove-shape extending in parallel to the isolation recess regions 108i. In some embodiments, a pair of the gate recess regions 108c may cross the cell active portions CA constituting each of the columns. In this case, a pair of cell transistors may be formed at each of the cell active portions CA.

A depth of the gate recess region 108c may be substantially equal to a depth of the isolation recess region 108i. A width of the gate recess region 108c may be substantially equal to or different from a width of the isolation recess region 108i. The depth of each of the gate and isolation recess regions 108c and 108i may be smaller than the depth of the cell trench 102.

A cell gate electrode CG may be disposed in each of the gate recess regions 108c, and a cell gate dielectric layer 110c may be disposed between the cell gate electrode CG and an inner surface of the gate recess region 108c. Due to the shape of the gate recess region 108c, the cell gate electrode CG may have a line-shape extending in the second direction. The cell transistor including the cell gate electrode CG may include a recessed channel region by the gate recess region 108c. A cell capping insulating pattern 112c may be disposed on the cell gate electrode CG. A top surface of the cell gate electrode CG may be lower than a top end of the gate recess region 108c, so that the cell capping insulating pattern 112c may be disposed in the gate recess region 108c. In some embodiments, a top surface of the cell capping insulating pattern 112c may be disposed at substantially the same level as the top end of the gate recess region 108c. As illustrated in FIG. 1D, the level of the top end of the gate recess region 108c may be substantially the same as a level 200 of a top surface of the semiconductor substrate 100.

An isolation gate IG may be disposed in each of the isolation recess regions 108i. An isolation gate dielectric layer 110i may be disposed between each of the isolation gates IG and an inner surface of each of the isolation recess regions 108i. The isolation gate IG may also have a line-shape extending in the second direction. An isolation capping insulating pattern 112i may be disposed on the isolation gate IG. A top surface of the isolation gate IG may be lower than a top end of the isolation recess region 108i. Thus, the isolation capping insulating pattern 112i may also be disposed in the isolation recess region 108i. A top surface of the isolation capping insulating pattern 112i may be disposed at substantially the same level as the top surface of the cell capping insulating pattern 112c. When the semiconductor device is operated, an isolation voltage may be applied to the isolation gates IG. The isolation voltage may prevent formation of a channel in the active line pattern ALP under the inner surface of the isolation recess region 108i. In other words, isolation channel regions under the isolation gates IG are turned-off by the isolation voltage. Thus, the cell active portions CA divided from the active line pattern ALP may be electrically isolated from each other. For example, if the active line pattern ALP is doped with P-type dopants, the isolation voltage may be a ground voltage or a negative voltage.

For example, the cell gate electrode CG may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide). In some embodiments, the isolation gate IG may be formed of the same material as the cell gate electrode CG. The cell gate dielectric layer 110c and the isolation gate dielectric layer 110i may include at least one of an oxide (e.g., silicon oxide), a nitride (e.g., silicon nitride), an oxynitride (e.g., silicon oxynitride), and a high-k dielectric material (e.g., an insulating metal oxide, such as hafnium oxide, aluminum oxide). The cell and isolation capping insulating patterns 112c and 112i may include at least one of an oxide (e.g., silicon oxide), a nitride (e.g., silicon nitride), and an oxynitride (e.g., silicon oxynitride).

A first source/drain region SD1 may be disposed in the cell active portion CA at a side of the cell gate electrode CG. A second source/drain region SD2 may be disposed in the cell active portion CA at another side of the cell gate electrode CG. In some embodiments, the first source/drain region SD1 may be disposed in each of the cell active portions CA between the pair of cell gate electrodes CG crossing the cell active portion CA, and a pair of the second source/drain regions SD2 may be disposed in both edge regions of each of the cell active portions CA, respectively. Here, the pair of cell gate electrodes CG may be disposed between the pair of the second source/drain regions SD2 in a plan view. Thus, the pair of cell transistors formed at each of the cell active portions CA may share the first source/drain region SD1. The first and second source/drain regions SD1 and SD2 may be doped with dopants of the second conductivity type different from the first conductivity type of the cell active portion CA. For example, one of the first and second conductivity types may be an N-type, and the other of the first and second conductivity types may be a P-type.

A peripheral gate electrode 116 may cross over the peripheral active portion PA in the second region 60. A peripheral gate dielectric layer 114 may be disposed between the peripheral gate electrode 116 and a top surface of the peripheral active portion PA. A peripheral capping insulating pattern 118 may be disposed on a top surface of the peripheral gate electrode 116. Gate spacers 120 may be disposed on both sidewalls of the peripheral gate electrode 116, respectively. Peripheral source/drain regions 122 may be disposed in the peripheral active portion PA at both sides of the peripheral gate electrode 116, respectively. The peripheral source/drain regions 122 may be doped with dopants of a conductivity type different from that of dopants of the peripheral active portion PA. Unlike the cell transistor, a peripheral transistor including the peripheral gate electrode 116 may include a planar channel region. In other words, the peripheral transistor may be a planar transistor.

A first ohmic pattern 135a is disposed on the first source/drain region SD1 and a second ohmic pattern 135b is disposed on the second source/drain region SD2. The first and second ohmic patterns 135a and 135b may include a metal-semiconductor compound formed by reaction between a semiconductor material of the cell active portion CA and a metal. If the semiconductor substrate 100 is the silicon substrate, the first and second ohmic patterns 135a and 135b may include a metal silicide. For example, the first and second ohmic patterns 135a and 135b may include cobalt silicide, nickel silicide, and/or titanium silicide.

Peripheral ohmic patterns 135p may be disposed on the peripheral source/drain regions 122, respectively. The peripheral ohmic patterns 135p may include the same metal-semiconductor compound as the first and second ohmic patterns 135a and 135b.

The first and second ohmic patterns 135a and 135b may be formed by the semiconductor material of the cell active portion CA and the metal, so that bottom surfaces of the first and second ohmic patterns 135a and 135b may be disposed at a level lower than the level 200 of the top surface of the semiconductor substrate 100 as illustrated in FIGS. 1C and 1D. The level 200 of the top surface of the semiconductor substrate 100 may correspond to a level of the top surface of the peripheral active portion PA under the peripheral gate electrode 116 in FIG. 1B.

Referring to FIGS. 1C and 1D, a top surface of the cell device isolation pattern 106r at both sides of the gate recess region 108c may be recessed to be lower than the level 200 of the top surface of the semiconductor substrate 100. The recessed top surface of the cell device isolation pattern 106r disposed at a first side of the gate recess region 108c may be disposed between the first ohmic patterns 135a adjacent to each other in the second direction. The recessed top surface of the cell device isolation pattern 106r disposed at a second side of the gate recess region 108c may be disposed between the second ohmic patterns 135b adjacent to each other in the second direction. A first interlayer dielectric layer 140 may fill the cell trench 102 on the recessed top surface of the cell device isolation pattern 106r. The first interlayer dielectric layer 140 may be formed of an oxide (e.g., silicon oxide), a nitride (e.g., silicon nitride), and/or an oxynitride (e.g., silicon oxynitride). The cell device isolation patterns 106r may be formed of an insulating material different from the cell sidewall oxide pattern 104. Thus, the recessed top surface of the cell device isolation pattern 106r may be disposed at a level lower than a top end of the cell sidewall oxide pattern 104 disposed on the inner sidewall of the cell trench 102. In some embodiments, the level of the top end of the cell sidewall oxide pattern 104 may be substantially the same as the level 200 of the top surface of the semiconductor substrate 100. For example, the cell sidewall oxide pattern 104 may be formed of an oxide (e.g., silicon oxide), and the cell device isolation pattern 106r may be formed of a nitride (e.g., silicon nitride) and/or an oxynitride (e.g., silicon oxynitride).

The cell capping insulating pattern 112c may be formed of an insulating material different from the cell device isolation pattern 106r. In this case, the recessed top surface of the cell device isolation pattern 106r may be disposed at a level lower than the top surface of the cell capping insulating pattern 112c, as illustrated in FIG. 1D. The level of the top surface of the cell capping insulating pattern 112c may be substantially the same as the level 200 of the top surface of the semiconductor substrate 100. In this case, the cell capping insulating pattern 112c may be formed of an oxide (e.g., silicon oxide), and the cell device isolation patterns 106 may be formed of a nitride (e.g., silicon nitride) and/or an oxynitride (e.g., silicon oxynitride).

In some embodiments, the recessed top surfaces of the cell device isolation patterns 106r may be disposed at a level higher than a bottom end of the cell gate electrode CG. In some embodiments, the recessed top surface of the cell device isolation patterns 106r may be disposed at a level lower than the bottom surfaces of the first and second ohmic patterns 135a and 135b.

As described above, the recessed top surfaces of the cell device isolation patterns 106r are lower than the level 200 of the top surface of the semiconductor substrate 100. Thus, it is possible to increase a length of a metal migration path between the second ohmic patterns 135b adjacent to each other in the second direction as illustrated in FIGS. 1A, 1C, and 1D. In more detail, the metal migration path may extend along an interface between the first interlayer dielectric layer 140 and the cell sidewall oxide pattern 104 and an interface between the first interlayer dielectric layer 140 and the recessed top surface of the cell device isolation pattern 106r. Since the recessed top surface of the cell device isolation pattern 106r is lower than the level 200 of the top surface of the semiconductor substrate 100, the metal migration path may increase by twice a height H of an upper inner sidewall of the cell trench 102 above the recessed top surface of the cell device isolation pattern 106r. As a result, a short between the adjacent second ohmic patterns 135b can be prevented.

Referring to FIGS. 1A to 1C again, the first interlayer dielectric layer 140 may cover an entire surface of the semiconductor substrate 100. Source lines SL may fill grooves formed in the first interlayer dielectric layer 140 of the first region 50, respectively. The source lines SL may extend in parallel to each other in the second direction. Each of the source lines SL may be electrically connected to the first ohmic patterns 135a arranged in the second direction. The source lines SL may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide).

A second interlayer dielectric layer 145 may be disposed on the first interlayer dielectric layer 140 and the source lines SL. The second interlayer dielectric layer 145 may be formed of an oxide (e.g., silicon oxide), a nitride (e.g., silicon nitride), and/or an oxynitride (e.g., silicon oxynitride).

Cell contact plugs 150 may successively penetrate the second and first interlayer dielectric layers 145 and 140. Each of the cell contact plugs 150 may be connected to each of the second ohmic patterns 135b. A first peripheral lower contact plug 151a may successively penetrate the second and first interlayer dielectric layers 145 and 140 and the peripheral capping insulating pattern 118 in the second region 60, so as to be connected to the peripheral gate electrode 116. A second peripheral lower contact plug 151b may successively penetrate the second and first interlayer dielectric layers 145 and 140 in the second region 60, so as to be connected to the peripheral ohmic pattern 135p. The contact plugs 150, 151a, and 151b may include at least one of a semiconductor material doped with dopants (e.g., doped silicon), a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide).

Data storage parts DSP may be disposed on the second interlayer dielectric layer 145 in the first region 50. The data storage parts DSP may be connected to the cell contact plugs 150, respectively. Thus, each of the data storage parts DSP may be electrically connected to each of the second source/drain regions SD2 through the cell contact plug 150 and the second ohmic pattern 135b. The data storage part DSP may store logic data. For example, the data storage part DSP may include one of a magnetic tunnel junction using magnetization directions, a transition metal oxide pattern using an electrical path, and a phase change material. The data storage part DSP will be described in more detail later.

A third interlayer dielectric layer 155 may be disposed on the second interlayer dielectric layer 145. In some embodiments, the third interlayer dielectric layer 155 in the first region 50 may fill a space between the data storage parts DSP and have a top surface substantially coplanar with top surfaces of the data storage parts DSP. In other embodiments, the third interlayer dielectric layer in the first region 50 may cover the top surfaces of the data storage parts DSP. The third interlayer dielectric layer 155 may be formed of an oxide (e.g., silicon oxide), a nitride (e.g., silicon nitride), and/or an oxynitride (e.g., silicon oxynitride).

A first peripheral upper contact plug 157a may penetrate the third interlayer dielectric layer 155 in the second region 60 and be connected to the first peripheral lower contact plug 151a. A second peripheral upper contact plug 157b may penetrate the third interlayer dielectric layer 155 in the second region 60 and be connected to the second peripheral lower contact plug 151b. The first and second peripheral upper contact plugs 157a and 157b are formed of a conductive material.

Bit lines BL may be disposed on the third interlayer dielectric layer 155 in the first region 50. Each of the bit lines BL may be electrically connected to a plurality of the data storage parts DSP arranged along the first direction. A first peripheral wire 160a and a second peripheral wire 160b may be disposed on the third interlayer dielectric layer 155 of the second region 60, so as to be connected to the first peripheral upper contact plug 157a and the second peripheral upper contact plug 157b, respectively. The bit lines BL and the first and second peripheral wires 160a and 160b may include at least one of a metal (e.g., tungsten, aluminum, titanium, and/or tantalum), a conductive metal nitride (e.g., titanium nitride, tantalum nitride, and/or tungsten nitride), and a metal-semiconductor compound (e.g., a metal silicide).

Figure 2A:
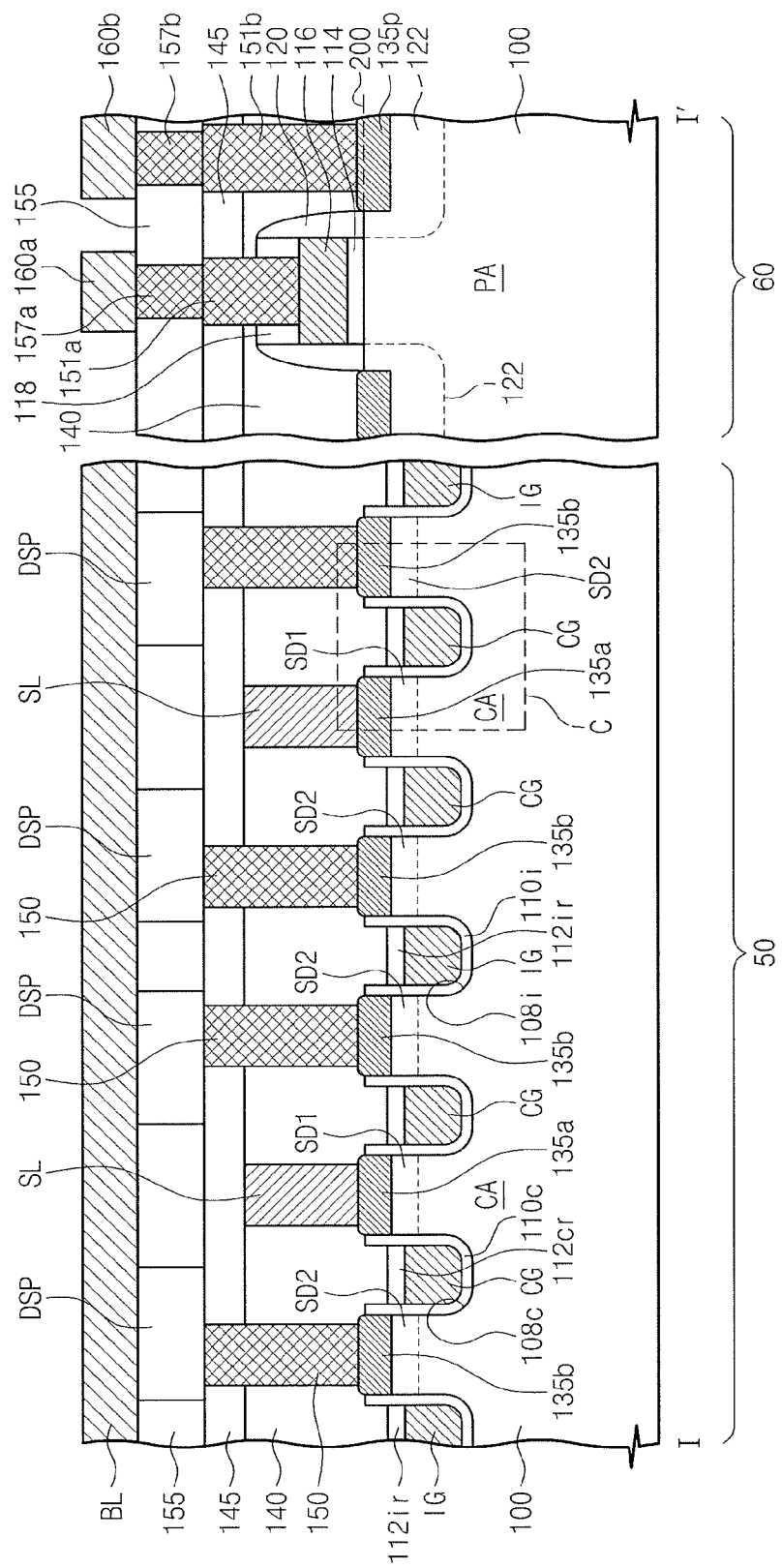
FIG. 2A illustrates a cross-sectional view taken along a line I-I of FIG. 1A to explain a modified example of a semiconductor device according to an embodiment.
Figure 2B:
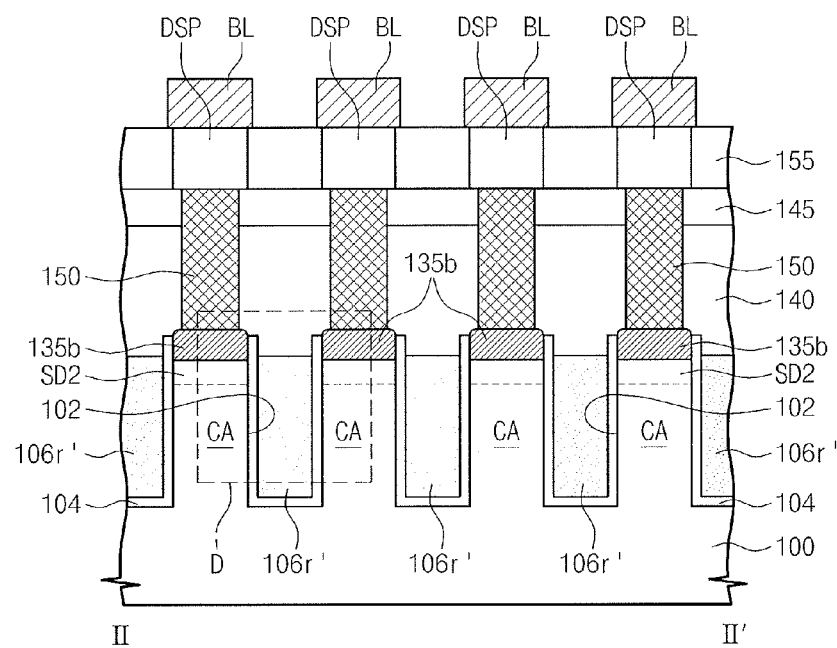
FIG. 2B illustrates a cross-sectional view taken along a line II-II of FIG. 1A to explain a modified example of a semiconductor device according to an embodiments.
Figure 2C:
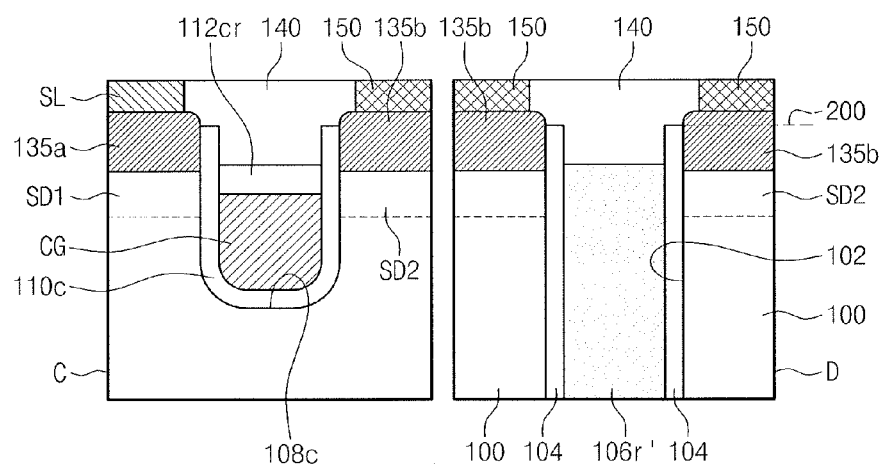
FIG. 2C illustrates an enlarged view of a portion C of FIG. 2A and a portion D of FIG. 2B.

FIG. 2A illustrates a cross-sectional view taken along a line I-I of FIG. 1A to explain a modified example of a semiconductor device according to an embodiment. FIG. 2B illustrates a cross-sectional view taken along a line II-II of FIG. 1A to explain a modified example of a semiconductor device according to an embodiment. FIG. 2C is an enlarged view illustrating a portion C of FIG. 2A and a portion D of FIG. 2B.

Referring to FIGS. 2A to 2C, cell capping insulating patterns 112cr may be formed of the same insulating material as cell device isolation patterns 106r'. In this case, a top surface of the cell device isolation pattern 106r' disposed at both sides of the gate recess region 108c and a top surface of the cell capping insulating pattern 112cr may be recessed to be lower than the level 200 of the top surface of the semiconductor substrate 100. In the present modified example, the recessed top surface of the cell capping insulating pattern 112cr may be disposed at substantially the same level as the recessed top surface of the cell device isolation pattern 106r'. Thus, the recessed top surface of the cell isolation pattern 106r' may be disposed at a level higher than the top surface of the cell gate electrode CG.

The recessed top surfaces of the cell device isolation pattern 106r' and the cell capping insulating pattern 112cr may be lower than the top end of the cell sidewall oxide pattern 104 disposed on the inner sidewall of the cell trench 102.

Likewise, a top surface of an isolation capping insulating pattern 112ir may be recessed to be lower than the level 200 of the top surface of the semiconductor substrate 100. The recessed top surface of the isolation capping insulating pattern 112ir may be disposed at substantially the same level as the recessed top surface of the cell device isolation pattern 106r'.

The first interlayer dielectric layer may fill the recess regions 108c and 108i on the recessed top surfaces of the capping insulating patterns 112cr and 112ir and the cell trench 102 on the recessed top surface of the cell device isolation patterns 106r'. For example, the cell device isolation patterns 106r' and the capping insulating patterns 112cr and 112ir may be formed of a nitride (e.g., silicon nitride) and/or an oxynitride (e.g., silicon oxynitride).

According to the present modified example, since the recessed top surfaces of the cell device isolation patterns 106r' are lower than the level 200 of the top surface of the semiconductor substrate 100, it is possible to prevent a short between the adjacent second ohmic patterns 135b in the second direction and a short between the adjacent first ohmic patterns 135a in the second direction. Additionally, since the top surfaces of the capping insulating patterns 112cr and 112ir are recessed to be lower than the level 200 of the top surface of the semiconductor substrate 100, it is possible to prevent a short between the first and second ohmic patterns 135a and 135b adjacent to each other in the first direction and/or a short between the second ohmic patterns 135b adjacent to each other in the first direction.

Next, various examples of the data storage part DSP will be described in more detail with reference to FIGS. 3A to 3D.

Figure 3A:
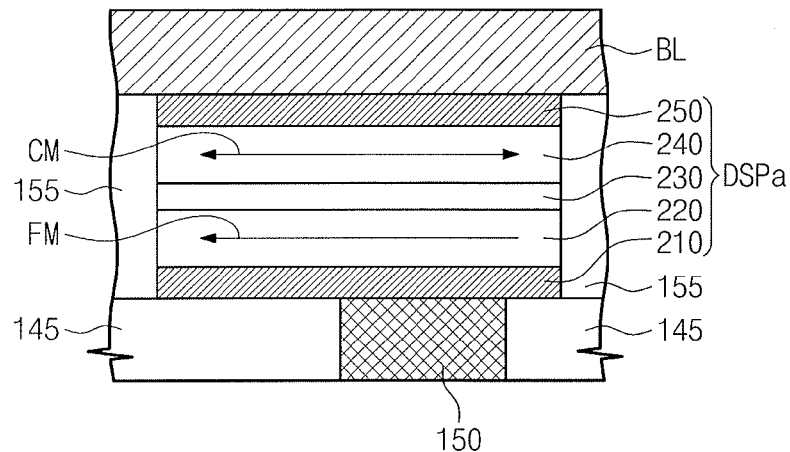
FIG. 3A illustrates a cross-sectional view of an example of a data storage part of a semiconductor device according to an embodiment.

FIG. 3A illustrates a cross-sectional view of an example of a data storage part of a semiconductor device according to an embodiments.

Referring to FIG. 3A, a data storage part DSPa according to the present example may include a reference pattern 220, a free pattern 240, and a tunnel barrier pattern 230 disposed between the reference pattern 220 and the free pattern 240. The reference pattern 220 has a magnetization direction FM fixed in one direction. The free pattern 240 has a magnetization direction CM configured to be changeable in parallel or anti-parallel with the magnetization direction FM of the reference pattern 220. The magnetization directions FM and CM of the reference and free patterns 220 and 240 may be in parallel with a surface of the tunnel barrier pattern 230 which is in contact with the free pattern 240. The reference pattern 220, the tunnel barrier pattern 230 and the free pattern 240 may constitute a magnetic tunnel junction.

If the magnetization direction CM of the free pattern 240 is parallel to the magnetization direction FM of the reference pattern 220, the data storage part DSP may have a first resistance value. If the magnetization direction CM of the free pattern 240 is anti-parallel to the magnetization direction FM of the reference pattern 220, the data storage part DSP may have a second resistance value greater than the first resistance value. The data storage part DSP may store logic data by using difference between the first and second resistance values. The magnetization direction CM of the free pattern 240 may be changeable by spin torque of electrons in a program current.

The reference pattern 220 and the free pattern 240 may include a ferromagnetic material. The reference pattern 220 may further include an anti-ferromagnetic material pinning the magnetization direction of the ferromagnetic material in the reference pattern 220. The tunnel barrier pattern 230 may include at least one of magnesium oxide, titanium oxide, aluminum oxide, magnesium-zinc oxide, and magnesium-boron oxide.

The data storage part DSPa may further include a lower electrode 210 and an upper electrode 250. The reference pattern 220, the tunnel barrier pattern 230, and the free pattern 240 may be disposed between the lower electrode 210 and the upper electrode 250. As illustrated in FIG. 3A, the reference pattern 220, the tunnel barrier pattern 230, and the free pattern 240 may be sequentially stacked on the lower electrode 210, and the upper electrode 250 may be disposed on the free pattern 240. Alternatively, the free pattern 240, the tunnel barrier pattern 230, and the reference pattern 220 may be sequentially stacked on the lower electrode 210, and the upper electrode 250 may be disposed on the reference pattern 220. The lower electrode 210 and the upper electrode 250 may include a conductive metal nitride (e.g. titanium nitride, tantalum nitride, and/or tungsten nitride).

Figure 3B:
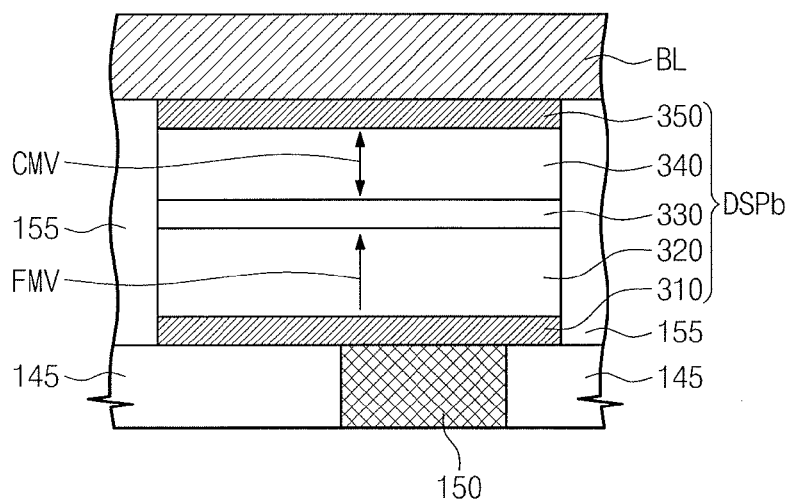
FIG. 3B illustrates a cross-sectional view of another example of a data storage part of a semiconductor device according to an embodiment.

FIG. 3B illustrates a cross-sectional view of another example of a data storage part of a semiconductor device according to an embodiments.

Referring to FIG. 3B, a data storage part DSPb according to the present example may include a reference perpendicular pattern 320, a free perpendicular pattern 340, and a tunnel barrier pattern 330 disposed between the reference perpendicular pattern 320 and the free perpendicular pattern 340. The reference perpendicular pattern 320 may have a magnetization direction FMV fixed in one direction. The free perpendicular pattern 340 may have a magnetization direction CMV configured to be changeable in parallel or in anti-parallel with the magnetization direction FMV of the reference perpendicular pattern 320. Here, the magnetization directions FMV and CMV of the reference and free perpendicular patterns 320 and 340 may be perpendicular to one surface of the tunnel barrier pattern 330 which is in contact with the free perpendicular pattern 340.

The reference and free perpendicular pattern 320 and 340 may include at least one of a perpendicular magnetic material (e.g. CoFeTb, CoFeGd, and/or CoFeDy), a perpendicular magnetic material having an L10 structure, CoPt of a hexagonal close packed (HCP) lattice structure, and a perpendicular magnetic structure. The perpendicular magnetic material having the L10 structure may include FePt of the L10 structure, FePd of the L10 structure, CoPd of the L10 structure, and/or CoPt of the L10 structure. The perpendicular magnetic structure may include magnetic layers and non-magnetic layers which are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, and (CoCr/Pd)n (where the n is the number of alternately stacking the magnetic layer and the non-magnetic layer). Here, the reference perpendicular pattern 320 may be thicker than the free perpendicular pattern 340 and/or a coercive force of the reference perpendicular pattern 320 may be greater than a coercive force of the free perpendicular pattern 340.

The tunnel barrier pattern 330 may include at least one of magnesium oxide, titanium oxide, aluminum oxide, magnesium-zinc oxide, and magnesium-boron oxide. The data storage part DSPb may further include a lower electrode 310 and an upper electrode 350. As illustrated in FIG. 3B, the reference perpendicular pattern 320, the tunnel barrier pattern 330, and the free perpendicular pattern 340 may be sequentially stacked on the lower electrode 310, and the upper electrode 350 may be disposed on the free perpendicular pattern 340. Alternatively, the free perpendicular pattern 340, the tunnel barrier pattern 330, and the reference perpendicular pattern 320 may be sequentially stacked on the lower electrode 310, and the upper electrode 350 may be disposed on the reference perpendicular pattern 320. The lower and upper electrode 310 and 350 may include a conductive metal nitride (e.g. titanium nitride, tantalum nitride, and/or tungsten nitride).

Figure 3C:
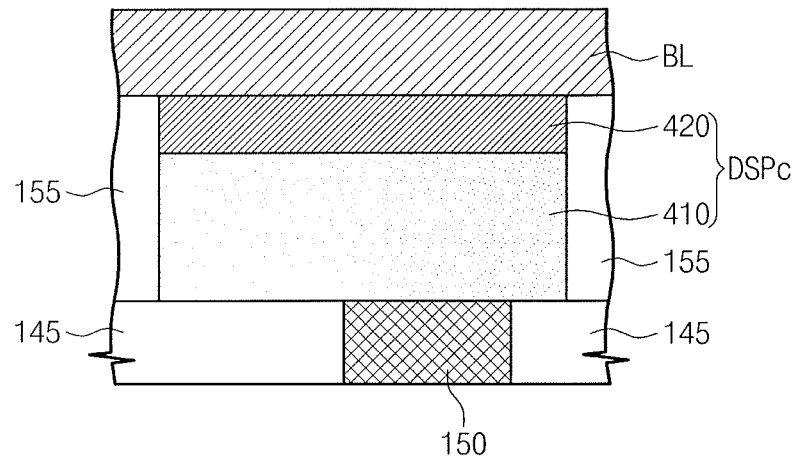
FIG. 3C illustrates a cross-sectional view of still another example of a data storage part of a semiconductor device according to an embodiment.

FIG. 3C illustrates a cross-sectional view of still another example of a data storage part of a semiconductor device according to an embodiment.

Referring to FIG. 3C, a data storage part DSPc according to the present example may include a phase change material pattern 410 and a capping electrode 420 sequentially stacked. A phase of the phase change material pattern 410 may be changed to a crystal state or an amorphous state by a temperature of a supplied heat and/or a supplying time of the heat. The phase change material pattern 410 in the crystal state may have a lower resistivity than that of the phase change pattern 410 in the amorphous state. The data storage part DSPc may store the logic data using difference between the resistivity of the crystal state and the resistivity of the amorphous state. In some embodiments, the cell contact plug 150 in contact with the phase change material pattern 410 may be used as a heater electrode. In this case, a portion of the phase change material pattern 410, which is adjacent to the cell contact plug 150, may correspond to a programming region. The programming region may be changed to the crystal state or the amorphous state.

The phase change material pattern 410 may include at least one of chalcogenide elements such as tellurium (Te) and selenium (Se). For example, the phase change material pattern 410 may include at least one of a Ge—Sb—Te compound, an As—Sb—Te compound, an As—Ge—Sb—Te compound, a Sn—Sb—Te compound, a Ag—In—Sb—Te compound, an In—Sb—Te compound, a group 5A element-Sb—Te compound, a group 6A element-Sb—Te compound, a group 5A element-Sb—Se compound, a group 6A element-Sb—Se compound, a Ge—Sb compound, an In—Sb compound, a Ga—Sb compound, and a doped Ge—Sb—Te compound. The doped Ge—Sb—Te compound may be doped with at least one of carbon (C), nitrogen (N), boron (B), bismuth (Bi), silicon (Si), phosphorus (P), aluminum (Al), dysprosium (Dy), and titanium (Ti). The capping electrode 420 may be formed of a conductive metal nitride.

Figure 3D:
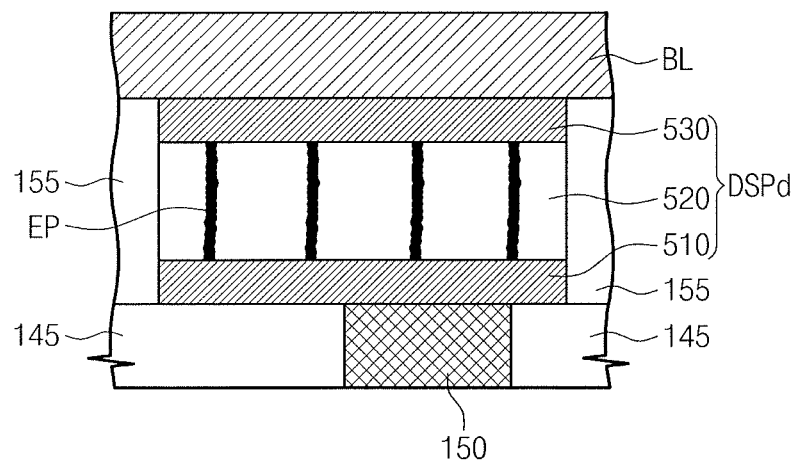
FIG. 3D illustrates a cross-sectional view of yet another example of a data storage part of a semiconductor device according to an embodiment.

FIG. 3D illustrates a cross-sectional view of yet another example of a data storage part of a semiconductor device according to an embodiment.

Referring to FIG. 3D, a data storage part DSPd according to the present example may include a lower electrode 510, an upper electrode 530, and a transition metal oxide pattern 520 disposed between the lower and upper electrodes 510 and 530. At least one electrical path EP may be generated in or disappear from the transition metal oxide pattern 520 by a programming operation. Both ends of the electrical path EP may be connected to the lower electrode 510 and the upper electrode 530, respectively. When the electrical path EP is generated, the data storage part DSPd may have a low resistance value. When the electrical path EP disappears, the data storage part DSPc may have a high resistance value. The data storage part DSPd may store the logic data using difference between the resistance values caused by the electrical path EP.

For example, the transition metal oxide pattern 520 may include at least one of niobium oxide, titanium oxide, nickel oxide, zirconium oxide, vanadium oxide, $(Pr,Ca)MnO_3$ (PCMO), strontium-titanium oxide, barium-strontium-titanium oxide, strontium-zirconium oxide, barium-zirconium oxide, and barium-strontium-zirconium oxide.

The lower and upper electrodes 510 and 530 may include at least one of conductive metal nitrides (e.g. titanium nitride, tantalum nitride, and/or tungsten nitride), transition metals (e.g. titanium and/or tantalum), and rare earth metals (e.g. ruthenium and/or platinum).

The data storage part DSP of FIGS. 1A to 1C may be realized as one of the data storage parts DSPa, DSPb, DSPc, and DSPd illustrated in FIGS. 3A to 3D.

FIGS. 4A to 9A illustrate cross-sectional views taken along a line I-I' of FIG. 1A to explain stages in a method of manufacturing a semiconductor device according to embodiments. FIGS. 4B to 9B illustrates cross-sectional views taken along a line II-IF of FIG. 1A to explain stages in a method of manufacturing a semiconductor device according to embodiments.

Figure 4B:
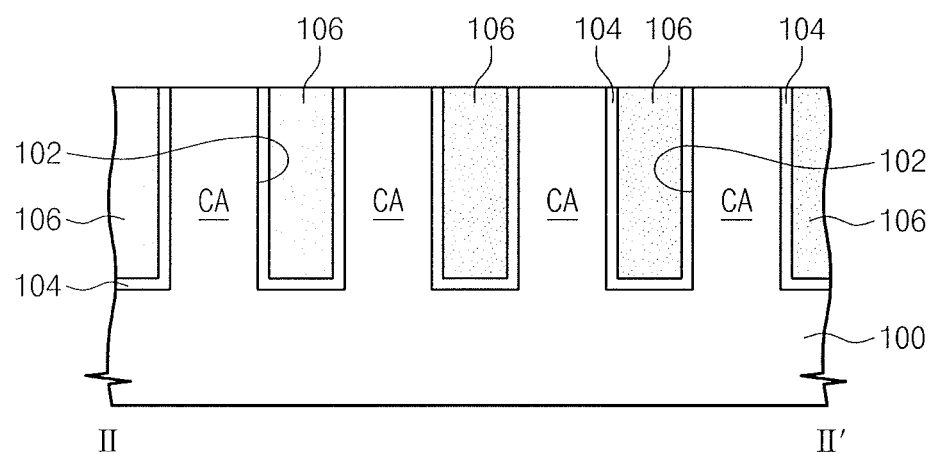

Referring to FIGS. 4A and 4B, a semiconductor substrate 100 including first and second regions 50 and 60 is prepared. Cell trenches 102 may be formed in the semiconductor substrate 100 of the first region 50 to define the active line patterns ALP of FIG. 1A in the first region 50. A peripheral trench (not shown) may be formed in the semiconductor substrate 100 of the second region 60 to define a peripheral active portion PA. An oxidation process may be performed on the semiconductor substrate 100 having the cell trenches 102 and the peripheral trench to form a cell sidewall oxide pattern 104 on an inner surface (e.g., an inner sidewall and a bottom surface) of each of the cell trenches 102 and a peripheral sidewall oxide pattern (not shown) on an inner surface of the peripheral trench. Etching damage of the inner surfaces of the cell trenches 102 and the inner surface of the peripheral trench may be cured by the oxidation process. The oxidation process may be a thermal oxidation process.

A cell device isolation pattern 106 may be formed in each of the cell trenches 102 having the cell sidewall oxide patterns 104. A peripheral device isolation pattern (not shown) may be formed in the peripheral trench having the peripheral sidewall oxide pattern. A top surface of the cell device isolation pattern 106 and a top surface of the peripheral device isolation pattern may be disposed at substantially the same level as a top surface of the semiconductor substrate 100. As described above, the cell device isolation pattern 106 may be formed of a different insulating material from the cell sidewall oxide pattern 104. The peripheral device isolation pattern may include the same insulating material as the cell device isolation pattern. Additionally, the peripheral device isolation pattern may further include an insulating material different from the cell device isolation pattern 106.

The active line patterns ALP and the cell device isolation patterns 106 in the first region 50 may be patterned to form gate recess regions 108c, and isolation recess regions 108i may be formed to extend in parallel to each other in the second direction of FIG. 1A. As described with reference to FIGS. 1A to 1D, the isolation recess regions 108i may divide each of the active line patterns ALP into a plurality of cell active portions CA. The gate recess regions 108c may cross the cell active portions CA. A depth of each of the recess regions 108c and 108i may be smaller than a depth of the cell trench 102.

Figure 5B:
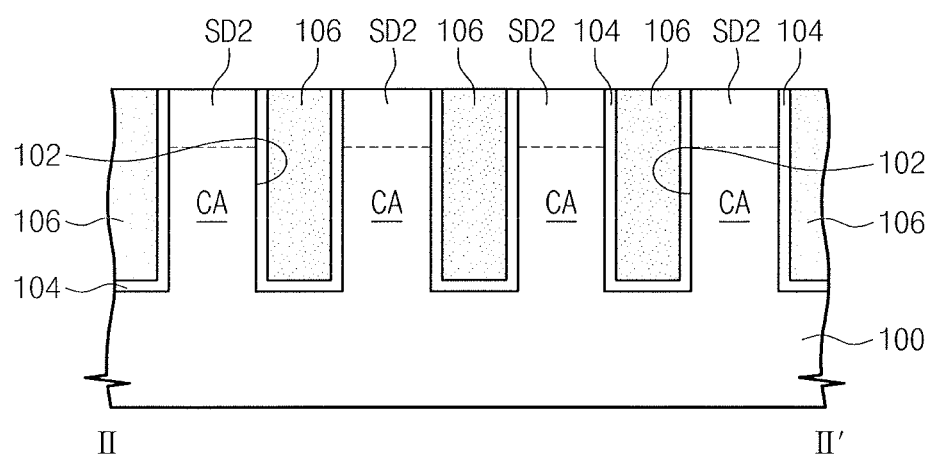

Referring to FIGS. 5A and 5B, a cell gate dielectric layer 110c may be conformally formed on an inner surface of each of the gate recess regions 108c. An isolation gate dielectric layer 110i may be conformally formed on an inner surface of each of the isolation recess regions 108i. In some embodiments, the cell and isolation gate dielectric layers 110c and 110i may be formed simultaneously. The cell gate dielectric layer 110c may also be formed on the cell active portions CA at both sides of the recess regions 108c and 108i.

A conductive layer may be formed to fill the recess regions 108c and 108i. The conductive layer may be etched to form a cell gate electrode CG in each of the gate recess regions 108c and an isolation gate IG in each of the isolation recess regions 108i. As illustrated in the drawing, top surfaces of the cell gate electrode CG and the isolation gate IG may be recessed to be lower than a level of a top surface of the semiconductor substrate 100 (i.e., a level of a top surface of the cell active portion CA).

Subsequently, a capping insulating layer may be formed on the semiconductor substrate to fill the recess regions 108c and 108i on the cell gate electrode CG and the isolation gate IG. The capping insulating layer may be planarized to form a cell capping insulating pattern 112c in each of the gate recess regions 108c and an isolation capping insulating pattern 112i in each of the isolation recess regions 108i. Top surfaces of the cell and isolation capping insulating patterns 112c and 112i may be disposed at substantially the same level as the top surface of the semiconductor substrate 100.

Dopants may be injected into each of the cell active portions CA at both sides of each of the cell gate electrodes CG to form a first source/drain region SD1 and a second source/drain region SD2. Bottom surfaces of the first and second source/drain regions SD1 and SD2 may be higher than a bottom end of the cell gate electrode CG.

A peripheral gate dielectric layer 114, a peripheral gate electrode 116, and a peripheral capping insulating pattern 118 may be sequentially stacked on the peripheral active portion PA in the second region 60. Peripheral source/drain regions 122 may be formed in the peripheral active portion PA at both sides of the peripheral gate electrode 116, respectively. Gate spacers 120 may be formed on both sidewalls of the peripheral gate electrode 116, respectively.

Figure 6A:
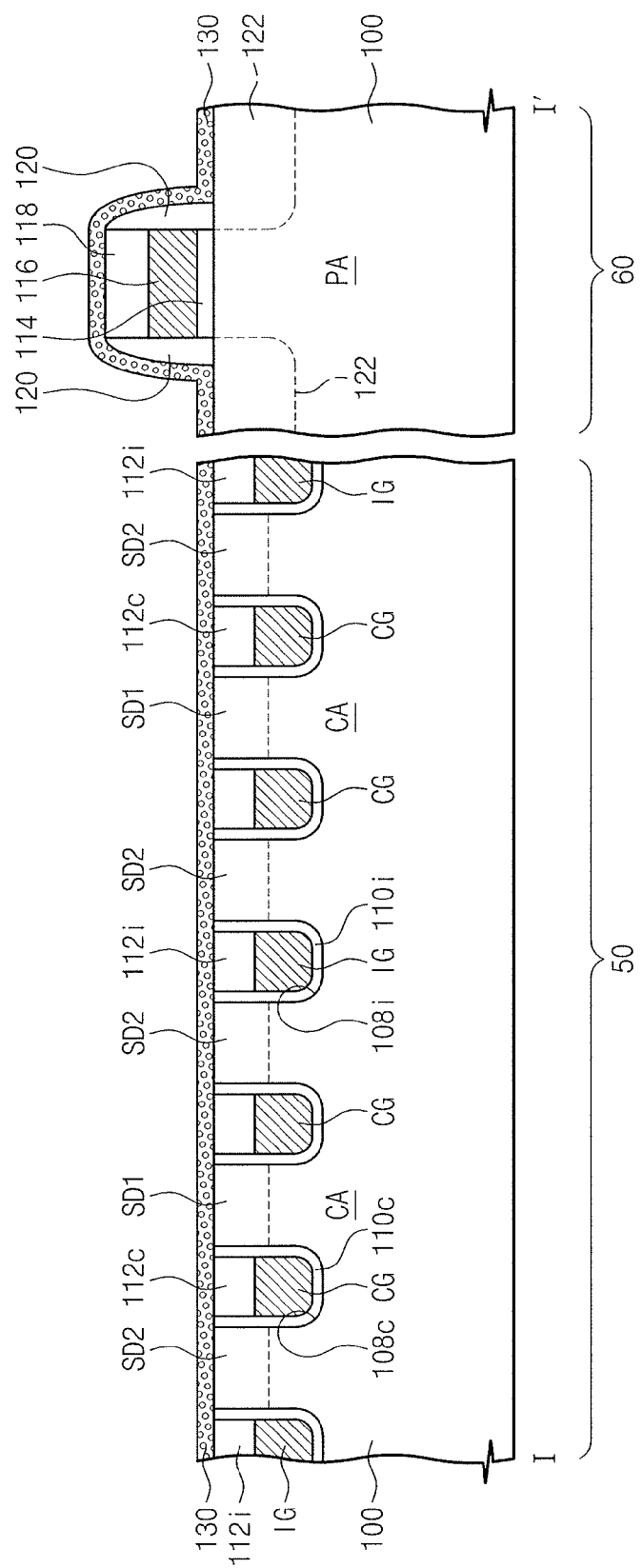
Figure 6B:
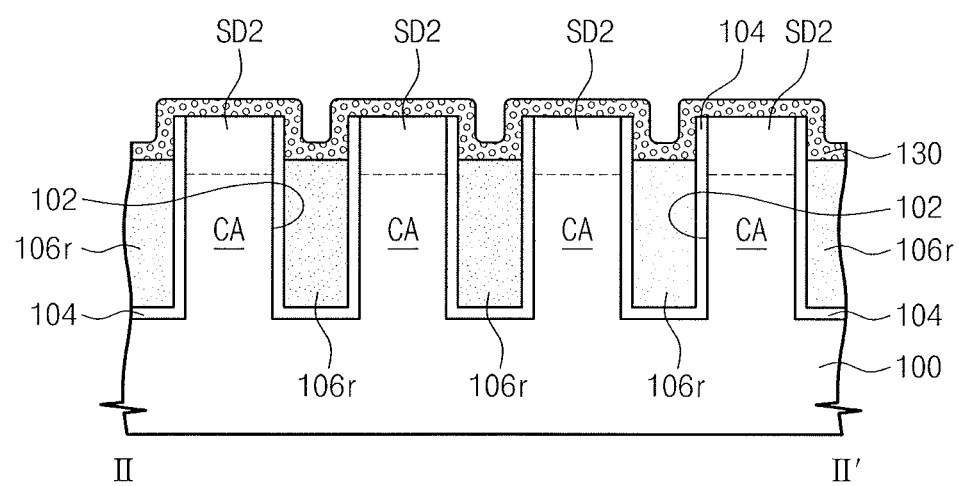

Referring to FIGS. 6A and 6B, the top surface of the cell device isolation pattern 106 at both sides of the cell recess region 108c may be recessed. A numeral number "106r" of FIG. 6B indicates the cell device isolation pattern 106r having the recessed top surface. The recessed top surface of the cell device isolation pattern 106r is located at a level lower than the top surface of the semiconductor substrate 100 (i.e., the top surface of the cell active portion CA). The recessed top surface of the cell device isolation pattern 106r at a first side of the cell recess region 108c is disposed between the first source/drain regions SD1 adjacent to each other in the second direction of FIG. 1A. The recessed top surface of the cell device isolation pattern 106r at a second side of the cell recess region 108c is disposed between the second source/drain regions SD2 adjacent to each other in the second direction of FIG. 1A.

As described above, the cell device isolation pattern 106r is formed of the different insulating material from the cell sidewall oxide pattern 104. Thus, the recessed top surface of the cell device isolation pattern 106r may be disposed at a level lower than a top end of the cell sidewall oxide pattern 104 on the inner sidewall of the cell trench 102.

In some embodiments, the cell and isolation capping insulating patterns 112c and 112i may be formed of a different insulating material from the cell device isolation pattern 106. In this case, when the cell device isolation pattern 106 is recessed, the cell and isolation capping insulating patterns 112c and 112i may be hardly recessed. Thus, top surfaces of the cell and isolation capping insulating patterns 112c and 112i may be higher than the recessed top surface of the cell device isolation pattern 106r. In some embodiments, the recessed top surface of the cell device isolation pattern 106r may be higher than the bottom end of the cell gate electrode CG in the gate recess region 108c.

When the cell device isolation pattern 106 is recessed, at least a portion of the peripheral device isolation pattern may also be recessed. Alternatively, after a mask pattern (not shown) may be formed in the second region 60, the cell device isolation patterns 106 may be recessed. In this case, the peripheral device isolation pattern may not be recessed.

Subsequently, a metal layer 130 may be conformally deposited on an entire surface of the semiconductor substrate 100. The metal layer 130 may include at least one of cobalt, nickel, and titanium. The metal layer 130 may conformally extend along an upper sidewall of the cell trench 102 on the cell device isolation pattern 106r and the recessed top surface of the cell device isolation pattern 106r. As a result, as illustrated in FIG. 6B, it is possible to increase an effective length of the metal layer 130 between the adjacent second source/drain regions SD2 by twice a height of the upper sidewall of the cell trench 102 above the cell device isolation pattern 106r.

The metal layer 130 in the first region 50 may be in contact with the top surfaces of the cell active portions CA at both sides of the cell gate electrodes CG (i.e., top surfaces of the first and second source/drain regions SD1 and SD2). The metal layer 130 in the second region 60 may be in contact with the top surface of the peripheral active portion PA at both sides of the peripheral gate electrode 112 (i.e., top surfaces of the peripheral source/drain regions 122).

Figure 7A:
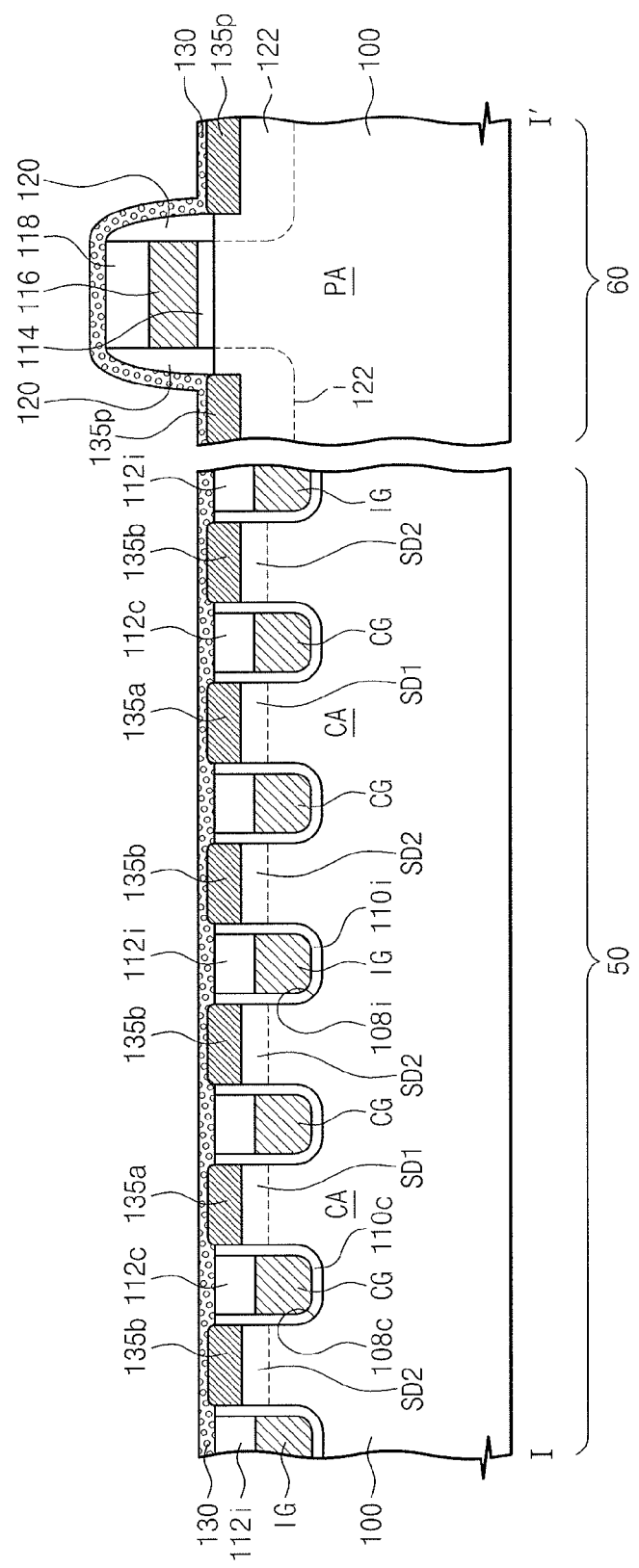
Figure 7B:
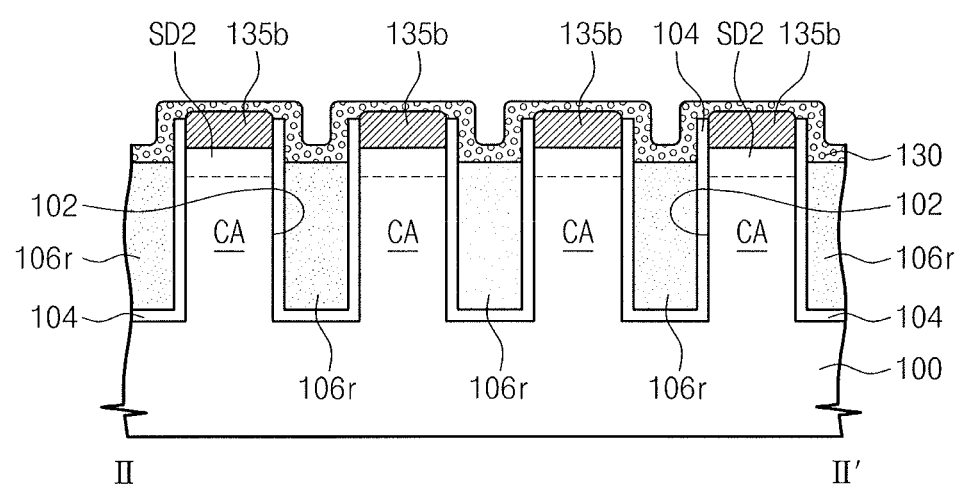

Referring to FIGS. 7A and 7B, a thermal treatment process may be performed to react a metal of the metal layer 130 with a semiconductor material of the active portions CA and PA. Thus, ohmic patterns 135a, 135b, and 135p are formed. A first ohmic pattern 135a is formed on the first source/drain region SD1 and a second ohmic pattern 135b is formed on the second source/drain region SD2. A peripheral ohmic pattern 135p is formed on the peripheral source/drain region 122.

As described above, since the recessed top surfaces of the cell device isolation pattern 106r at both sides of the gate recess region 108c are lower than the top surface of the semiconductor substrate 100, it is possible to increase the effective length of the metal layer 130 between the adjacent second ohmic patterns 135b illustrated in FIG. 7B. Additionally, it is possible to increase the effective length of the metal layer 130 between the first ohmic patterns 135a adjacent to each other in the second direction of FIG. 1A. As a result, it is possible to prevent a short between the adjacent second ohmic patterns 135b and a short between the adjacent first ohmic patterns 135a caused by over-growth of the ohmic patterns 135a and 135b.

The thermal treatment process may be a rapid thermal treatment process. The deposition process of the metal layer 130 and the thermal treatment process may be performed in-situ.

Figure 8A:
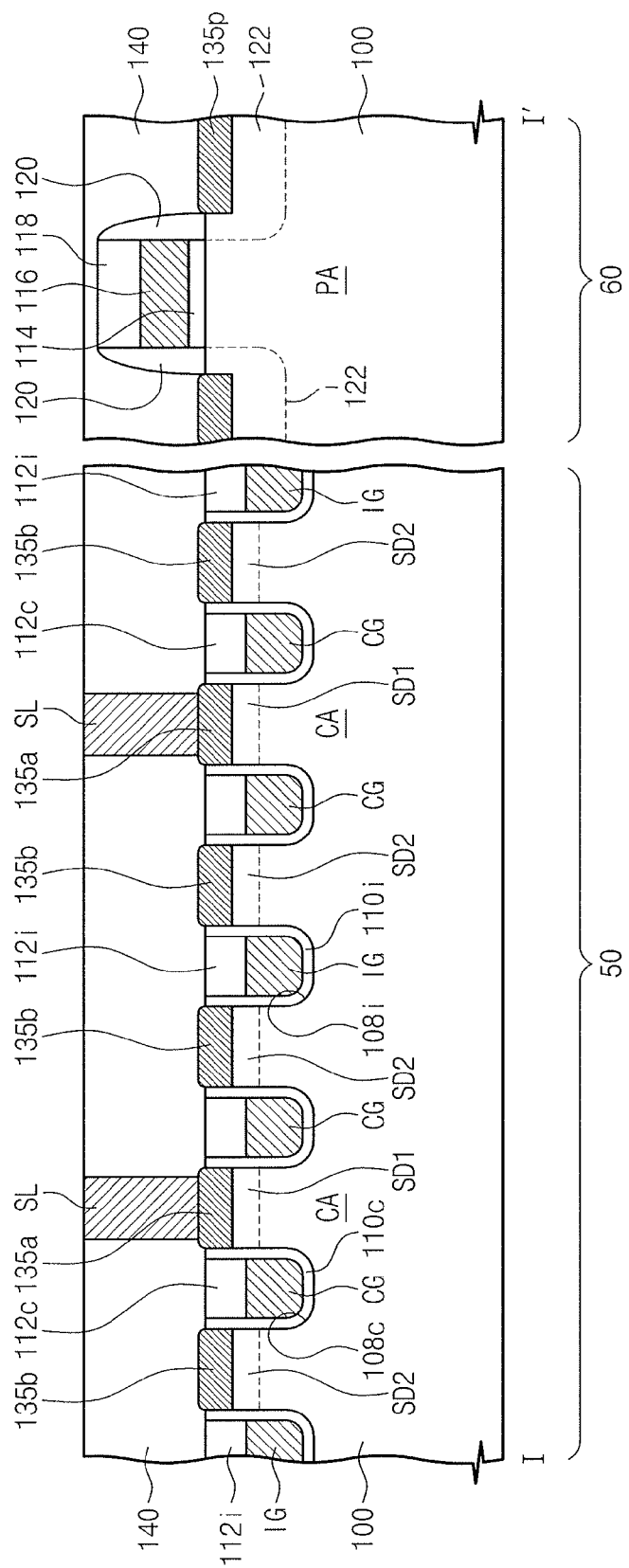
Figure 8B:
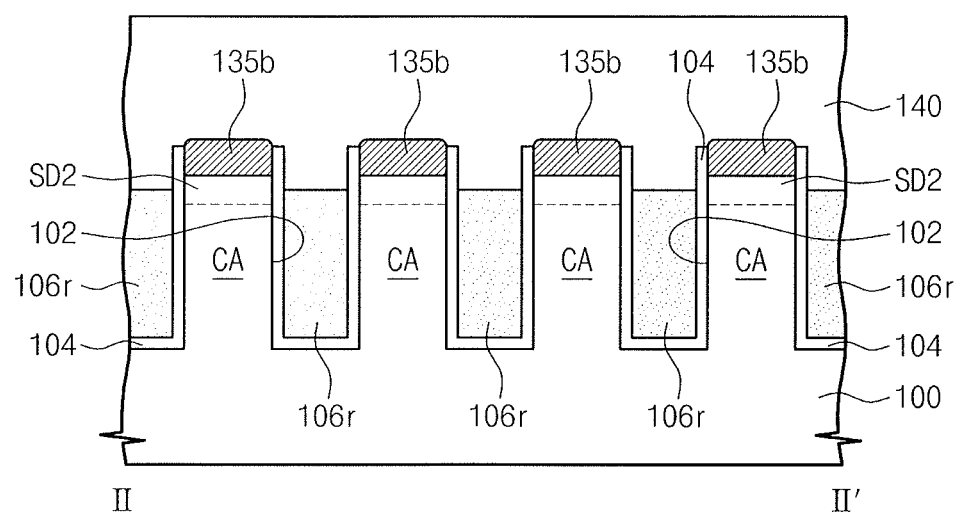

Referring to FIGS. 8A and 8B, a non-reacted metal layer 130 may be removed. Next, a first interlayer dielectric layer 140 may be formed on the semiconductor substrate 100. Grooves may be formed in the first interlayer dielectric layer 140 of the first region 50 and then source lines SL may be formed in the grooves of the first interlayer dielectric layer 140, respectively. The source lines SL may be in contact with the first ohmic patterns 135a.

Figure 9A:
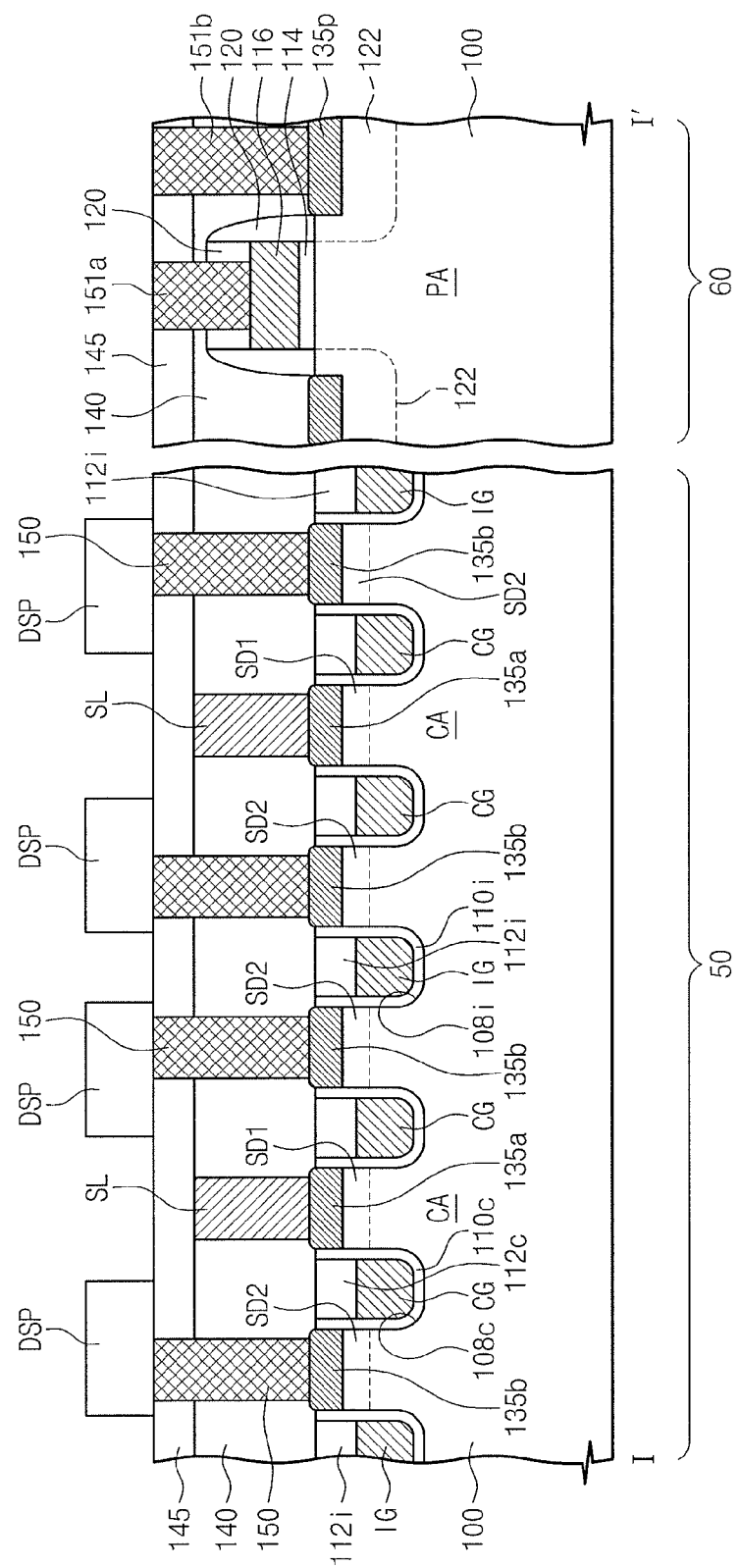
Figure 9B:
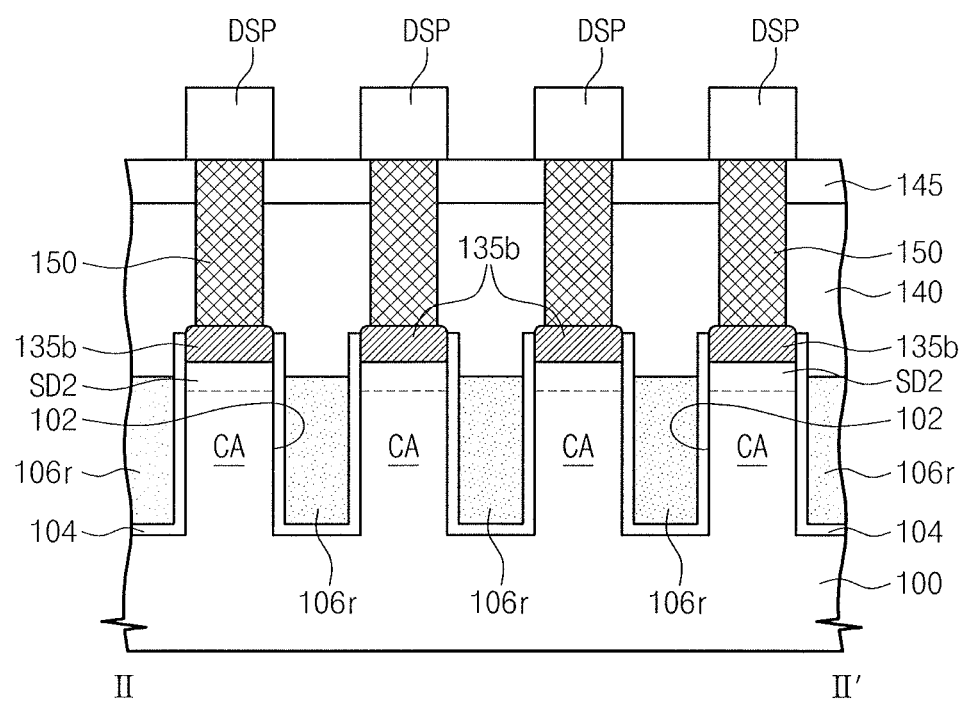

Referring to FIGS. 9A and 9B, a second interlayer dielectric layer 145 may be formed on the first interlayer dielectric layer 140 and the source lines SL.

Cell contact plugs 150 may be formed to successively penetrate the second and first interlayer dielectric layers 145 and 140 in the first region 50. The cell contact plugs 150 may be connected to the second ohmic patterns 135b, respectively. A first peripheral lower contact plug 151a may be formed to successively penetrate the second and first interlayer dielectric layers 145 and 140 and the peripheral capping insulating pattern 118 in the second region 60. A second peripheral lower contact plug 151b may be formed to successively penetrate the second and first interlayer dielectric layers 145 and 140. The first and second peripheral lower contact plugs 151a and 151b may be connected to the peripheral gate electrode 116 and the peripheral ohmic pattern 135p, respectively. The contact plugs 150, 151a, and 151b may be formed simultaneously.

Data storage parts DSP may be formed on the second interlayer dielectric layer 145 in the first region 50. The data storage parts DSP may be connected to the cell contact plugs 150, respectively.

Referring to FIGS. 1A to 1C again, a third interlayer dielectric layer 155 may be formed on the semiconductor substrate 100. In some embodiments, the third interlayer dielectric layer 155 may be planarized until the data storage parts DSP are exposed. Alternatively, the third interlayer dielectric layer 155 may be planarized and the planarized third interlayer dielectric layer 155 may cover the top surfaces of the data storage parts DSP.

First and second upper contact plugs 157a and 157b may be formed to penetrate the third interlayer dielectric layer 155 in the second region 60. The first and second upper contact plugs 157a and 157b may be connected to the first and second lower contact plugs 151a and 151b, respectively. The bit lines BL may be formed on the third interlayer dielectric layer 155 of the first region 50. The first and second peripheral wires 160a and 160b may be formed on the third interlayer dielectric layer 155 of the second region 60. Thus, the semiconductor device illustrated in FIGS. 1A to 1D may be realized.

Figure 10A:
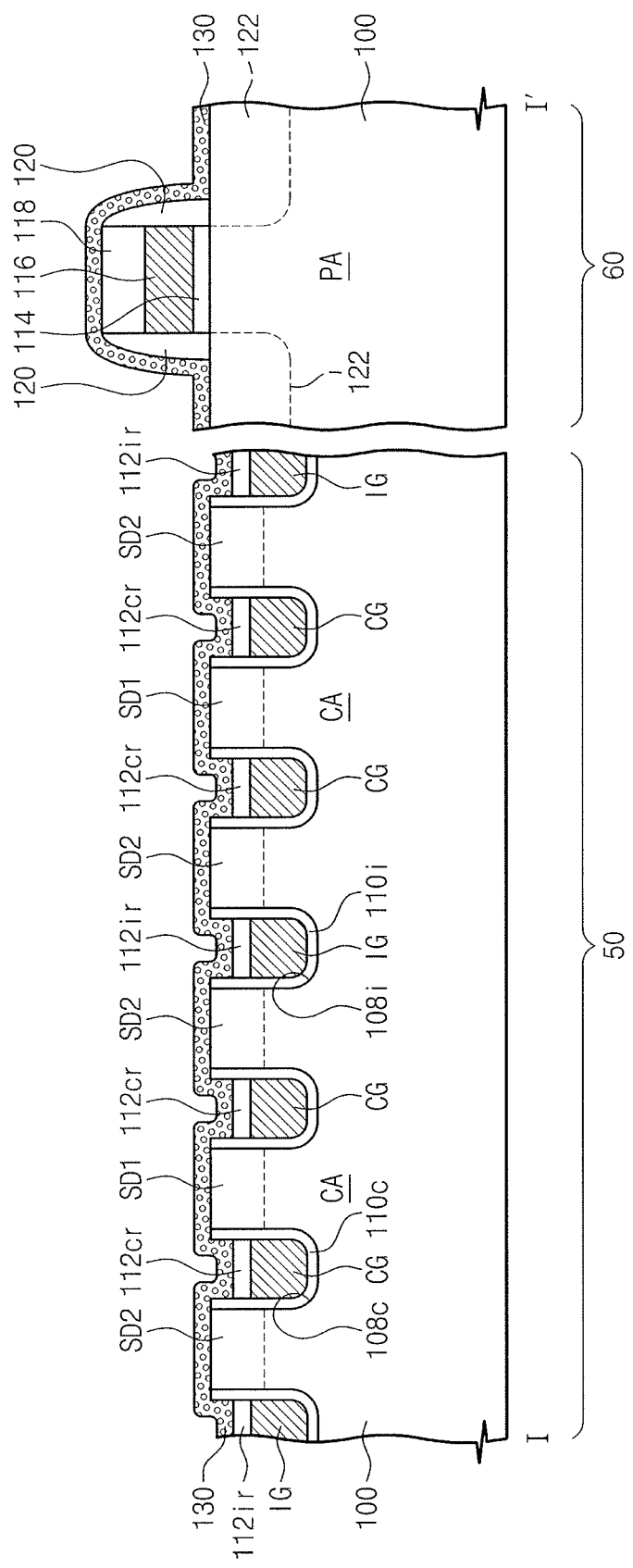
FIG. 10A illustrates a cross-sectional view taken along a line I-I' of FIG. 1A to explain a modified example of a method of manufacturing a semiconductor device according to an embodiment.
Figure 10B:
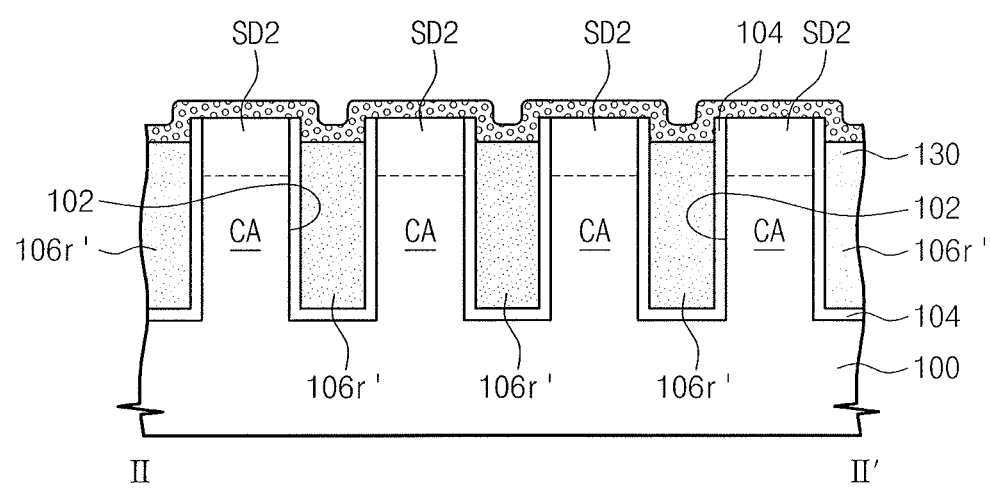
FIG. 10B illustrates a cross-sectional view taken along a line II-II' of FIG. 1A to explain a modified example of a method of manufacturing a semiconductor device according to an embodiment.

FIG. 10A illustrates a cross-sectional view taken along a line I-I' of FIG. 1A to explain a modified example of a method of manufacturing a semiconductor device according to an embodiment. FIG. 10B illustrates a cross-sectional view taken along a line II-II' of FIG. 1A to explain a modified example of a method of manufacturing a semiconductor device according to an embodiment.

According to the present modified example, cell and isolation capping insulating patterns 112c and 112i may be formed of the same insulating material as the cell device isolation patterns 106. Thus, as illustrated in FIGS. 10A and 10B, top surfaces of the cell and isolation capping insulating patterns 112c and 112i may also be recessed when the top surfaces of the cell device isolation pattern 106 at both sides of the gate recess regions 108c are recessed. Top surfaces of the recessed cell and isolation capping insulating patterns 112cr and 112ir may be disposed at substantially the same level as the recessed top surfaces of the cell device isolation patterns 106r'. Here, the recessed top surfaces of the cell and isolation capping insulating patterns 112cr and 112ir and the cell device isolation patterns 106r' may be higher than the top surface of the cell gate electrode CG. Thus, the cell gate electrode CG is not exposed. Subsequent processes after this may be performed as described with reference to FIGS. 7A to 9A and 7B to 9B.

The semiconductor devices described above may be encapsulated using various packaging techniques. For example, the semiconductor devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic metric quad flat package (PMQFP) technique, a plastic quad flat package (PQFP) technique, a small outline package (SOIC) technique, a shrink small outline package (SSOP) technique, a thin small outline package (TSOP) technique, a thin quad flat package (TQFP) technique, a system in package (SIP) technique, a multi chip package (MCP) technique, a wafer-level fabricated package (WFP) technique, and a wafer-level processed stack package (WSP) technique.

The package in which the semiconductor device according to one of the above embodiments is mounted may further include at least one semiconductor device (e.g., a controller and/or a logic device) that controls the semiconductor memory device.

Figure 11:
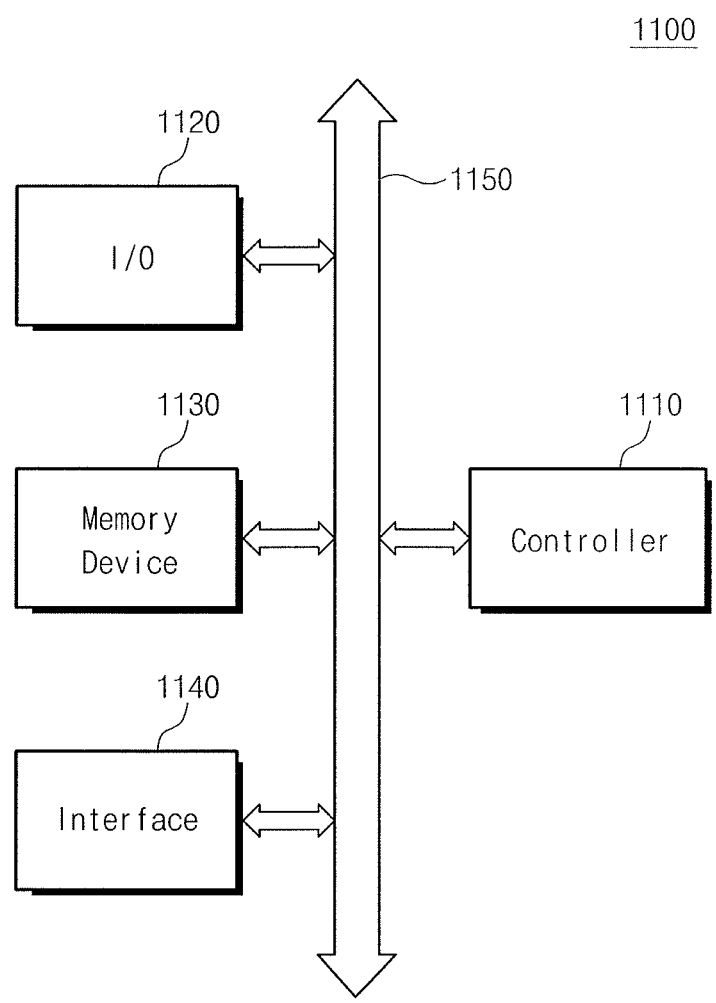
FIG. 11 illustrates a schematic block diagram of an example of electronic systems including the semiconductor devices according to embodiments.

FIG. 11 illustrates a schematic block diagram of an example of an electronic system including semiconductor devices according to embodiments.

Referring to FIG. 11, an electronic system 1100 according to an embodiment may include a controller 1110, an input/output (I/O) unit 1120, a memory device 1130, an interface unit 1140, and a data bus 1150. At least two of the controller 1110, the I/O unit 1120, the memory device 1130, and the interface unit 1140 may communicate with each other through the data bus 1150. The data bus 1150 may correspond to a path through which electrical signals are transmitted.

The controller 1110 may include at least one of a microprocessor, a digital signal processor, a microcontroller, and other logic devices. The other logic devices may have a similar function to any one of the microprocessor, the digital signal processor and the microcontroller. The I/O unit 1120 may include a keypad, a keyboard, and/or a display unit. The memory device 1130 may store data and/or commands. The memory device 1130 may include at least one of the semiconductor devices according to the embodiments described above. The memory device 1130 may further include another type of semiconductor memory devices (e.g., a DRAM device and/or a SRAM device) which are different from the semiconductor devices described above. The interface unit 1140 may transmit electrical data to a communication network or may receive electrical data from a communication network. The interface unit 1140 may operate wirelessly or by cable. For example, the interface unit 1140 may include an antenna for wireless communication or a transceiver for cable communication. Although not shown in the drawings, the electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card, or other electronic products. The other electronic products may receive or transmit information data wirelessly.

Figure 12:
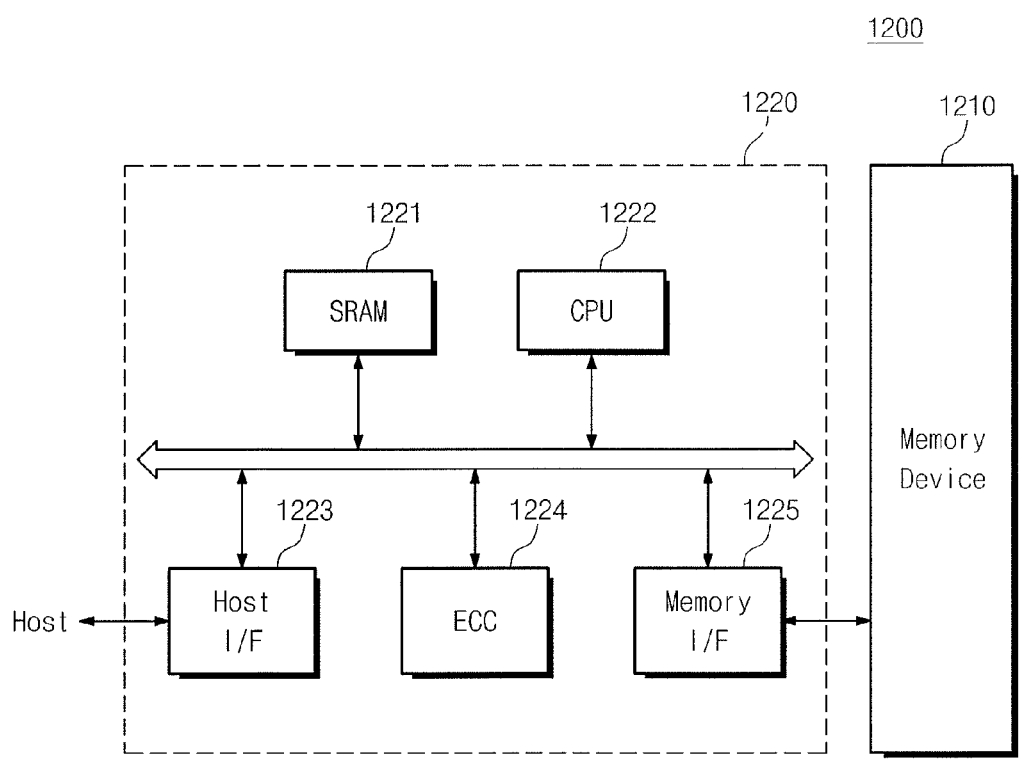
FIG. 12 illustrates a schematic block diagram illustrating an example of memory cards including the semiconductor devices according to embodiments.

FIG. 12 illustrates a schematic block diagram of an example of memory cards including semiconductor devices according to embodiments.

Referring to FIG. 12, a memory card 1200 according to an embodiment may include a memory device 1210. The memory device 1210 may include at least one of the semiconductor devices according to the embodiments mentioned above. In other embodiments, the memory device 1210 may further include another type of semiconductor memory devices (e.g., a DRAM device and/or a SRAM device) which are different from the semiconductor devices according to the embodiments described above. The memory card 1200 may include a memory controller 1220 that controls data communication between a host and the memory device 1210.

The memory controller 1220 may include a central processing unit (CPU) 1222 that controls overall operations of the memory card 1200. In addition, the memory controller 1220 may include an SRAM device 1221 used as an operation memory of the CPU 1222. Moreover, the memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error check and correction (ECC) block 1224. The ECC block 1224 may detect and correct errors of data which are read out from the memory device 1210. Even though not shown in the drawings, the memory card 1200 may further include a read only memory (ROM) device that stores code data to interface with the host. The memory card 1200 may be used as a portable data storage card. Alternatively, the memory card 1200 may realized as solid state disks (SSD) which are used as hard disks of computer systems.

By way of summation and review, one or more embodiments may provide a top surface of the device isolation pattern at both sides of the gate recess region that is recessed to be lower than the level of the top surface of the semiconductor substrate. Thus, it is possible to prevent a short between the first ohmic patterns adjacent to each other and/or a short between the second ohmic patterns adjacent to each other in the longitudinal direction of the gate electrode. Embodiments may provide semiconductor devices having improved reliability and methods of manufacturing the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
    active portions defined in a semiconductor substrate;
    a device isolation pattern in a trench between the active portions;
    a gate electrode in a gate recess region crossing the active portions and the device isolation pattern;
    a gate dielectric layer between the gate electrode and an inner surface of the gate recess region; and
    a first ohmic pattern and a second ohmic pattern on each of the active portions at both sides of the gate electrode, respectively, the first and second ohmic patterns including a metal-semiconductor compound,
    wherein a top surface of the device isolation pattern at both sides of the gate recess region is recessed to be lower than a level of a top surface of the semiconductor substrate.

2. The semiconductor device of claim 1, wherein:
    the recessed top surface of the device isolation pattern at a first side of the gate recess region is between the first ohmic patterns which are on the active portions, respectively, and are adjacent to each other in a longitudinal direction of the gate electrode; and
    the recessed top surface of the device isolation pattern at a second side of the gate recess region is between the second ohmic patterns which are on the active portions, respectively, and are adjacent to each other in the longitudinal direction of the gate electrode.

3. The semiconductor device of claim 1, further comprising:
    a sidewall oxide pattern on an inner sidewall and a bottom surface of the trench,
    wherein the device isolation pattern is on the sidewall oxide pattern and in the trench, and
    wherein a top end of the sidewall oxide pattern on the inner sidewall of the trench is higher than the recessed top surface of the device isolation pattern.

4. The semiconductor device of claim 1, further comprising:
    a capping insulating pattern on the gate electrode,
    wherein a top surface of the gate electrode is at a level lower than the level of the top surface of the semiconductor substrate; and
    wherein the capping insulating pattern is in the gate recess region.

5. The semiconductor device of claim 4, wherein:
    a top surface of the capping insulating pattern is at a level higher than the recessed top surface of the device isolation pattern; and
    the capping insulating pattern is formed of a different insulating material from the device isolation pattern.

6. The semiconductor device of claim 4, wherein:
    a top surface of the capping insulating pattern is at substantially the same level as the recessed top surface of the device isolation pattern; and
    the capping insulating pattern is formed of a same insulating material as the device isolation pattern.

7. The semiconductor device of claim 1, wherein bottom surfaces of the first and second ohmic patterns are at a level higher than a top surface of the gate electrode.

8. The semiconductor device of claim 1, wherein the recessed top surface of the device isolation pattern is at a level higher than a bottom end of the gate electrode.

9. The semiconductor device of claim 1, further comprising:
    isolation gates in isolation recess regions formed in the semiconductor substrate, respectively; and
    an isolation gate dielectric layer between each of the isolation gates and each of the isolation recess regions,
    wherein the isolation recess regions are parallel to the gate recess region, and
    wherein the active portion is defined between the isolation gates adjacent to each other.

10. The semiconductor device of claim 1, further comprising:

a source line electrically connected to the first ohmic pattern; and a data storage part electrically connected to the second ohmic pattern.

* * * * *